(12) United States Patent
Nomura et al.

(10) Patent No.: US 7,453,102 B2
(45) Date of Patent: Nov. 18, 2008

(54) NITRIDE-BASED SEMICONDUCTOR LASER DEVICE

(75) Inventors: Yasuhiko Nomura, Moriguchi (JP);
Takashi Kano, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 23 days.

(21) Appl. No.: 11/147,334

(22) Filed: Jun. 8, 2005

(65) Prior Publication Data

US 2005/0224835 A1    Oct. 13, 2005

Related U.S. Application Data

(62) Division of application No. 10/356,504, filed on Feb. 3, 2003, now Pat. No. 6,954,478.

(30) Foreign Application Priority Data

Feb. 4, 2002  (JP)  ............................. 2002-26316

(51) Int. Cl.
*H01L 27/15* (2006.01)
*H01L 29/26* (2006.01)
*H01L 31/12* (2006.01)
*H01L 33/00* (2006.01)

(52) U.S. Cl. ................................ 257/103; 257/E33.008

(58) Field of Classification Search ................. 257/103, 257/13, 96, E33.028, E33.033
See application file for complete search history.

(56) References Cited

U.S. PATENT DOCUMENTS

| 4,328,469 A | 5/1982 | Scifres et al. | |
| 5,048,036 A * | 9/1991 | Scifres et al. | 372/45.011 |
| 6,067,309 A | 5/2000 | Onomura et al. | |

(Continued)

FOREIGN PATENT DOCUMENTS

JP    9-214048    8/1997

(Continued)

OTHER PUBLICATIONS

Foreign Office Action: Reference No. NPA1030004, Dispatch No. 036135, Dispatch Date: Feb. 2, 2006, Patent Application No. 2003-025608, Drafting Date: Jan. 25, 2006, Examiner of JPO: Kazuyo Kadota 3412 2K00, Representative: Mr. Hirokazu Miyazano.

(Continued)

*Primary Examiner*—Evan Pert
*Assistant Examiner*—Ben P Sandvik
(74) *Attorney, Agent, or Firm*—McDermott Will & Emery LLP

(57) ABSTRACT

A nitride-based semiconductor laser device capable of elongating the life thereof is obtained. This nitride-based semiconductor laser device comprises a first cladding layer consisting of a first conductivity type nitride-based semiconductor, an emission layer, formed on the first cladding layer, consisting of a nitride-based semiconductor and a second cladding layer, formed on the emission layer, consisting of a second conductivity type nitride-based semiconductor, while the emission layer includes an active layer emitting light, a light guiding layer for confining light and a carrier blocking layer, arranged between the active layer and the light guiding layer, having a larger band gap than the light guiding layer.

2 Claims, 12 Drawing Sheets

U.S. PATENT DOCUMENTS

| | | | |
|---|---|---|---|
| 6,383,829 B1 * | 5/2002 | Sakata | 438/31 |
| 6,548,834 B2 * | 4/2003 | Sugawara et al. | 257/90 |
| 6,586,762 B2 | 7/2003 | Kozaki | |
| 6,795,471 B2 | 9/2004 | Watanabe et al. | |
| 2002/0003234 A1 | 1/2002 | Hayashi et al. | |
| 2004/0056259 A1 * | 3/2004 | Goto et al. | 257/79 |

FOREIGN PATENT DOCUMENTS

| | | |
|---|---|---|
| JP | 09-214048 | 8/1997 |
| JP | 11-243251 | 9/1999 |
| JP | 2000-196194 | 7/2000 |
| JP | 2003-086903 A | 3/2003 |

OTHER PUBLICATIONS

Shin-ichi Nagahara et al., "High-Power and Long-Lifetime InGaN Multi-Quantum-Well Laser Diodes Grown on Low-Dislocation-Density GaN Substrates", Japanese Journal of Applied Physics, vol. 39, (2000), L647-650.

Japanese Office Action for Corresponding Application No. JP 2003-025608. Date of Dispatch Jul. 20, 2006.

* cited by examiner

NITRIDE-BASED SEMICONDUCTOR LASER DEVICE

RELATED APPLICATION

This application is a divisional of U.S. application Ser. No. 10/356,504 filed on Feb. 3, 2003, now U.S. Pat. No. 6,954,478.

BACKGROUND OF THE INVENTION

1. Field of the Invention

The present invention relates to a nitride-based semiconductor laser device, and more particularly, it relates to a nitride-based semiconductor laser device formed by successively crystal-growing an active layer, a cladding layer and the like.

2. Description of the Background Art

A nitride-based semiconductor laser device expected as the light source for an advanced large capacity optical disk has recently been actively developed. In general, a semiconductor laser device has important characteristics such as a threshold current and an operating current. The semiconductor laser device starts lasing with the threshold current, and the operating current is reduced as the threshold current is reduced. Therefore, the threshold current is preferably minimized.

Reduction of the threshold current is generally attempted also in the nitride-based semiconductor laser device. When the threshold current is reduced, the operating current necessary for driving the nitride-based semiconductor laser device can also be reduced and hence the device can be prevented from deterioration resulting from rise of the internal temperature following increase of the operating current. Thus, it is important to reduce the threshold current also for elongating the life of the nitride-based semiconductor laser device.

In order to reduce the threshold current, light spreading from an emission layer to a cladding layer must generally be reduced for efficiently confining light in the emission layer for the following reason: When the difference between the refractive indices of the emission layer and the cladding layer is reduced for increasing light spreading in a conventional nitride-based semiconductor laser device, the difference between the band gaps of these layers is so reduced as to increase the number of carriers (electrons and holes) overflowing from the emission layer into the cladding layer. If the number of the overflowing carriers is increased, it is difficult to emit light and hence the threshold current as well as the operating current are disadvantageously increased. In general, therefore, the difference between the refractive index of the emission layer and that of the cladding layer is increased to increase the difference between the band gaps thereof in order to inhibit the carriers from overflowing and reduce the threshold current. When the difference between the refractive indices of the emission layer and the cladding layer is increased, light spreading from the emission layer to the cladding layer is reduced and hence light is efficiently confined in the emission layer. Consequently, optical density is increased in the emission layer to increase the vertical beam divergence angle.

Thus, the conventional nitride-based semiconductor laser device is prepared to increase the vertical beam divergence angle to about 30°. For example, Japanese Journal of Applied Physics, Volume 39 (2000), L647-650 discloses such a nitride-based semiconductor laser device. The nitride-based semiconductor laser device disclosed in this literature has a vertical beam divergence angle of 29.9°.

However, the aforementioned conventional nitride-based semiconductor laser device having a large vertical beam divergence angle has the following problem: The nitride-based semiconductor laser device includes a larger number of crystal defects such as dislocations than an AlGaAs- or AlGaInP-based semiconductor laser device emitting infrared or red light. Further, the nitride-based semiconductor laser device emits purple or ultraviolet light having a short wavelength, and such short-wavelength light has large energy in lasing. The aforementioned conventional nitride-based semiconductor laser device having a large vertical beam divergence angle formed to reduce light spreading remarkably confines light in the emission layer. Therefore, the optical density is increased in the device to easily cause light absorption resulting from crystal defects such as dislocations. Such light absorption results in consumption of excess energy, to disadvantageously increase the operating current. When the operating current is increased, the internal temperature of the device rises to reduce the band gap, leading to large light absorption resulting from crystal defects. Consequently, the device is so abruptly deteriorated that it is difficult to elongate the life of the aforementioned nitride-based semiconductor laser device having a large vertical beam divergence angle.

SUMMARY OF THE INVENTION

An object of the present invention is to provide a nitride-based semiconductor laser device capable of elongating the life thereof.

Another object of the present invention is to enable the aforementioned nitride-based semiconductor laser device to increase light spreading from an emission layer to a cladding layer.

In order to attain the aforementioned objects, a nitride-based semiconductor laser device according to a first aspect of the present invention comprises a first cladding layer consisting of a first conductivity type nitride-based semiconductor, an emission layer, formed on the first cladding layer, consisting of a nitride-based semiconductor, and a second cladding layer, formed on the emission layer, consisting of a second conductivity type nitride-based semiconductor, while the emission layer includes an active layer emitting light, a light guiding layer for confining light and a carrier blocking layer, arranged between the active layer and the light guiding layer, having a larger band gap than the light guiding layer.

The nitride-based semiconductor laser device according to the first aspect, provided with the carrier blocking layer having a larger band gap than the light guiding layer between the active layer and the light guiding layer as hereinabove described, can inhibit carriers (electrons and holes) from overflowing from the emission layer into the cladding layers through the carrier blocking layer also when the difference between the refractive indices of the emission layer and the cladding layers is reduced thereby increasing light spreading. Thus, a threshold current and an operating current can be inhibited from increase resulting from difficulty in light emission followed by overflow of the carriers. Consequently, the nitride-based semiconductor laser device can be inhibited from deterioration resulting from rise of the internal temperature following increase of the operating current, whereby the life of the device can be elongated.

In the aforementioned nitride-based semiconductor laser device according to the first aspect, the light guiding layers are preferably formed on the upper and lower surfaces of the active layer respectively, and the carrier blocking layers are preferably arranged both between the active layer and the light guiding layer formed on the upper surface of the active layer and between the active layer and the light guiding layer formed on the lower surface of the active layer. According to this structure, the carrier blocking layers can inhibit carriers (electrons and holes) from overflowing from the emission layer into the first and second cladding layers.

The aforementioned nitride-based semiconductor laser device according to the first aspect preferably further comprises a light spreading layer, arranged at least either between the emission layer and the first cladding layer or between the emission layer and the second cladding layer, having a smaller refractive index and a larger band gap than the adjacent first or second cladding layer. According to this structure, the light spreading layer can increase light spreading from the emission layer to the first or second cladding layer due to the refractive index smaller than that of the first or second cladding layer and strongly confine carriers in the emission layer due to the band gap larger than that of the first or second cladding layer. Thus, light spreading can be so increased as to reduce optical density in the device. Consequently, light absorption resulting from crystal defects can be so reduced as to suppress increase of the operating current resulting from light absorption. Further, the carriers can be strongly confined in the emission layer as hereinabove described, whereby the carriers (electrons and holes) can be further inhibited from overflowing from the emission layer into the cladding layers. Therefore, the threshold current and the operating current can be further inhibited from increase followed by overflow of the carriers. Thus, the operating current can be further inhibited from increase, whereby the device can be further inhibited from deterioration resulting from rise of the internal temperature following increase of the operating current, so that the life of the device can be further elongated.

In this case, the light spreading layers are preferably arranged both between the emission layer and the first cladding layer and between the emission layer and the second cladding layer. According to this structure, light spreading from the emission layer to both of the first and second cladding layers can be increased while the carriers can be more strongly confined in the emission layer.

In the aforementioned nitride-based semiconductor laser device including the carrier blocking layer and the light spreading layer, at least either the carrier blocking layer or the light spreading layer preferably contains one or two elements selected from a group consisting of B, Al, In, Ga and Tl. According to this structure, the carrier blocking layer having a larger band gap than the light guiding layer and the light spreading layer having a smaller refractive index and a larger band gap than the first or second cladding layer can be easily formed.

In the aforementioned nitride-based semiconductor laser device according to the first aspect, at least either the first cladding layer or the second cladding layer preferably consists of a nitride containing Al, Ga and In. According to this structure, the difference between the band gaps of the emission layer and the cladding layers can be kept large also when the difference between the refractive indices of the emission layer and the cladding layers is reduced, whereby the carriers can be easily strongly confined in the emission layer also when light spreading from the emission layer to the cladding layers is increased.

In the aforementioned nitride-based semiconductor laser device according to the first aspect, the carrier blocking layer may consist of a nitride containing Al, Ga and In. Further, the nitride-based semiconductor laser device may further comprise a light spreading layer, arranged at least either between the emission layer and the first cladding layer or between the emission layer and the second cladding layer, having a smaller refractive index and a larger band gap than the adjacent first or second cladding layer, and at least either the carrier blocking layer or the light spreading layer may consist of a nitride containing Al, Ga and In.

At least either the first cladding layer or the second cladding layer preferably consists of a nitride, containing Al, Ga and In, having a lattice constant substantially identical to that of GaN. According to this structure, formation of crystal defects resulting from difference between lattice constants of either cladding layer and an underlayer can be remarkably suppressed when the underlayer consists of GaN.

In the aforementioned nitride-based semiconductor laser device according to the first aspect, the emission layer preferably includes an active layer consisting of either a single quantum well structure or a multiple quantum well structure. According to this structure, optical confinement can be easily controlled.

In the aforementioned nitride-based semiconductor laser device according to the first aspect, the first cladding layer consisting of the first conductivity type nitride-based semiconductor is preferably formed on a first conductivity type nitride-based semiconductor substrate. According to this structure, the first cladding layer can be formed with a small number of crystal defects.

In the aforementioned nitride-based semiconductor laser device according to the first aspect, a vertical beam divergence angle is preferably not more than 20°. According to this structure, light spreading from the emission layer to the first and second cladding layers is so increased that optical density in the device can be reduced. Thus, light absorption resulting from crystal defects can be so reduced as to suppress increase of the operating current. Consequently, the device can be inhibited from deterioration resulting from rise of the internal temperature following increase of the operating current, whereby the life of the device can be elongated.

A nitride-based semiconductor laser device according to a second aspect of the present invention comprises a first cladding layer consisting of a first conductivity type nitride-based semiconductor, an emission layer, formed on the first cladding layer, consisting of a nitride-based semiconductor, and a second cladding layer, formed on the emission layer, consisting of a second conductivity type nitride-based semiconductor, while the emission layer includes an active layer emitting light and a light guiding layer formed on at least either the upper surface or the lower surface of the active layer for confining light, and the nitride-based semiconductor laser device further comprises a light spreading layer, arranged between the light guiding layer and either the first or second cladding layer being formed on the same side of the light guiding layer, having a smaller refractive index and a larger band gap than the either first or second cladding layer being formed on the same side of the light guiding layer.

In the nitride-based semiconductor laser device according to the second aspect, as hereinabove described, the emission layer includes the active layer and the light guiding layer, while the light spreading layer having a smaller refractive index and a larger band gap than the adjacent first or second cladding layer is provided between the light guiding layer and the first cladding layer or between the light guiding layer and the second cladding layer to be capable of increasing light spreading from the emission layer to the first or second cladding layer due to the refractive index smaller than that of the first or second cladding layer and strongly confining carriers in the emission layer due to the band gap larger than that of the first or second cladding layer. Thus, light spreading can be so increased that optical density can be reduced in the device. Therefore, light absorption resulting from crystal defects can be so reduced as to suppress increase of the operating current resulting from light absorption. Further, the carriers can be more strongly confined in the emission layer as hereinabove described, whereby the carriers (electrons and holes) can be more inhibited from overflowing from the emission layer into the cladding layer. Therefore, the threshold current and the operating current can be more inhibited from increase followed by overflow of the carriers. Thus, the operating current can be more inhibited from increase, whereby the device can be more inhibited from deterioration resulting from rise of the internal temperature following increase of the operating current. Consequently, the life of the device can be more elongated.

An impurity level is formed on the interface between the light guiding layer and the light spreading layer. Light absorption may result from this impurity level to increase the operating current and the threshold current. In the nitride-based semiconductor laser device according to the second aspect, the light spreading layer is separated from the active layer by the thickness of the light guiding layer, whereby optical density can be reduced on the position of the interface between the light guiding layer and the light spreading layer. Consequently, light absorption resulting from the impurity level on the aforementioned interface can be so suppressed as to further inhibit the operating current and the threshold current from increase.

The aforementioned nitride-based semiconductor laser device according to the second aspect preferably further includes light guiding layers for confining light on both of the upper and lower surfaces of the active layer. According to this structure, the light guiding layers positioned on both sides of the active layer can easily adjust optical confinement in the emission layer.

The aforementioned nitride-based semiconductor laser device according to the second aspect preferably further comprises another light spreading layer arranged between the light active layer and either the second or first cladding layer being formed on the opposite side of the light guiding layer, having a smaller refractive index and a larger band gap than the either second or first cladding layer being formed on the opposite side of the light guiding layer. According to this structure, the two light spreading layers can increase light spreading from the emission layer to the first and second cladding layers due to the refractive indices smaller than those of the first and second cladding layers and further strongly confine carriers in the emission layer due to the band gaps larger than those of the first and second cladding layers.

The aforementioned nitride-based semiconductor laser device according to the second aspect preferably further comprises a carrier blocking layer having a larger band gap than the light guiding layer between the active layer and the light guiding layer. According to this structure, the carrier blocking layer can inhibit carriers (electrons and holes) from overflowing from the emission layer into the cladding layer(s) also when the difference between the refractive indices of the emission layer and the cladding layer(s) is reduced thereby increasing light spreading. Thus, the threshold current and the operating current can be further inhibited from increase resulting from difficulty in light emission followed by overflow of the carriers.

In the aforementioned nitride-based semiconductor laser device including the carrier blocking layer and the light spreading layer, at least either the carrier blocking layer or the light spreading layer preferably contains one or two elements selected from a group consisting of B, Al, In, Ga and Tl. According to this structure, the carrier blocking layer having a larger band gap than the light guiding layer and the light spreading layer having a smaller refractive index and a larger band gap than the first or second cladding layer can be easily formed.

In the aforementioned nitride-based semiconductor laser device according to the second aspect, at least either the first cladding layer or the second cladding layer preferably consists of a nitride containing Al, Ga and In. According to this structure, the difference between the band gaps of the emission layer and the cladding layers can be kept large also when the difference between the refractive indices of the emission layer and the cladding layers is reduced, whereby the carriers can be easily strongly confined in the emission layer also when light spreading from the emission layer to the cladding layers is increased.

In the aforementioned nitride-based semiconductor laser device according to the second aspect, the light spreading layer may consist of a nitride containing Al, Ga and In.

At least either the first cladding layer or the second cladding layer preferably consists of a nitride, containing Al, Ga and In, having a lattice constant substantially identical to that of GaN. According to this structure, formation of crystal defects resulting from difference between lattice constants of either cladding layer and an underlayer can be remarkably suppressed when the underlayer consists of GaN.

In the aforementioned nitride-based semiconductor laser device according to the second aspect, the emission layer preferably includes an active layer consisting of either a single quantum well structure or a multiple quantum well structure. According to this structure, optical confinement can be easily controlled.

In the aforementioned nitride-based semiconductor laser device according to the second aspect, the first cladding layer consisting of the first conductivity type nitride-based semiconductor is preferably formed on a first conductivity type nitride-based semiconductor substrate. According to this structure, the first cladding layer can be formed with a small number of crystal defects.

In the aforementioned nitride-based semiconductor laser device according to the second aspect, a vertical beam divergence angle is preferably not more than 20°. According to this structure, light spreading from the emission layer to the first and second cladding layers is so increased that optical density in the device can be reduced. Thus, light absorption resulting from crystal defects can be so reduced as to suppress increase of the operating current. Consequently, the device can be inhibited from deterioration resulting from rise of the internal temperature following increase of the operating current, whereby the life of the device can be elongated.

A nitride-based semiconductor laser device according to a third aspect of the present invention comprises a first cladding layer consisting of a first conductivity type nitride-based semiconductor, an emission layer, formed on the first cladding layer, consisting of a nitride-based semiconductor, and a second cladding layer, formed on the emission layer, consisting of a second conductivity type nitride-based semiconductor, and the nitride-based semiconductor laser device reduces the degree of optical confinement in the emission layer thereby reducing a vertical beam divergence angle to not more than 20°.

The nitride-based semiconductor laser device according to the third aspect reduces the degree of optical confinement in the emission layer thereby setting the vertical beam divergence angle to not more than 20° as hereinabove described, whereby light spreading from the emission layer into the first and second cladding layers is so increased that optical density in the device can be reduced. Thus, light absorption resulting from crystal defects can be so reduced as to suppress increase of the operating current. Consequently, the device can be inhibited from deterioration resulting from rise of the internal temperature following increase of the operating current, so that the life of the device can be elongated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
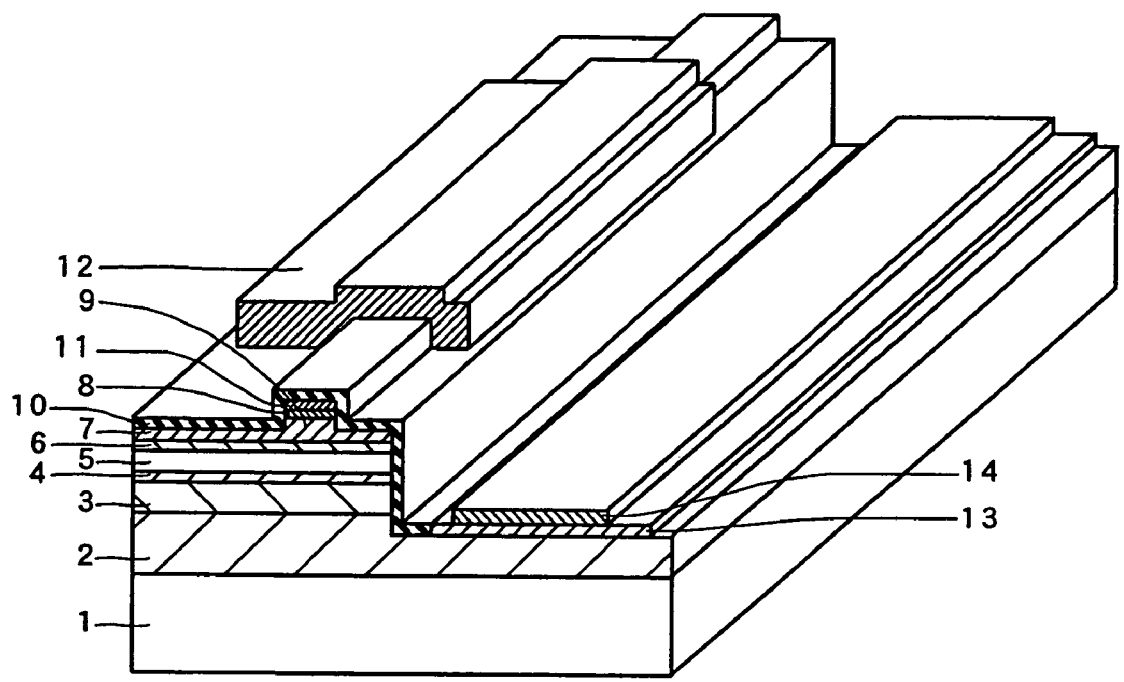
FIG. 1 is a perspective view showing the structure of a nitride-based semiconductor laser device according to a first embodiment of the present invention.
Figure 2:
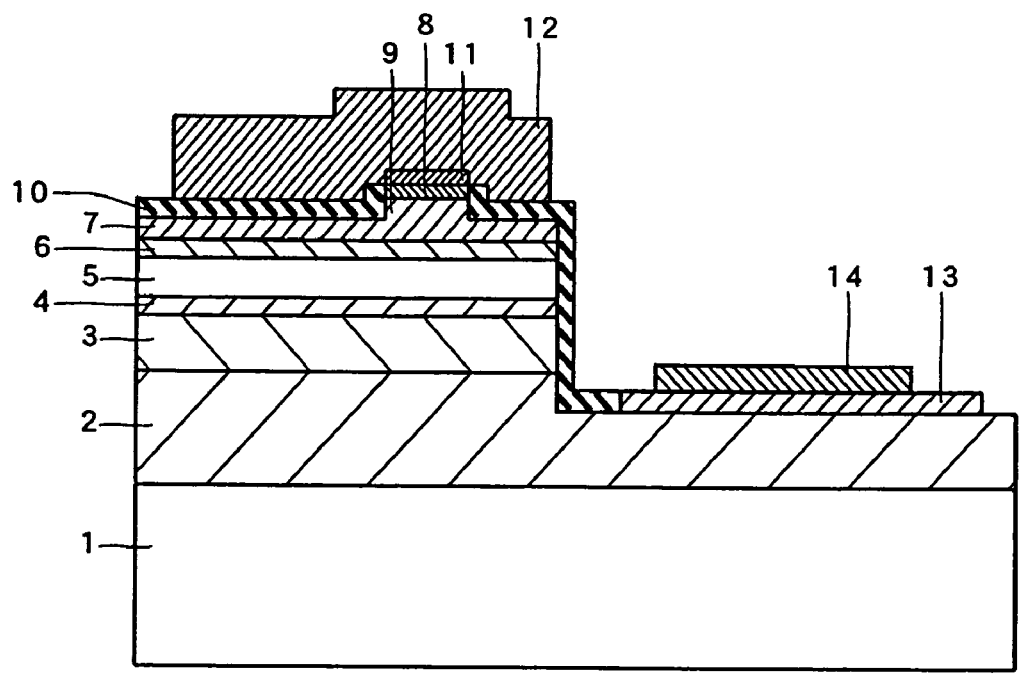
FIG. 2 is a sectional view showing the nitride-based semiconductor laser device according to the first embodiment of the present invention.

The structure of a nitride-based semiconductor laser device according to a first embodiment of the present invention is described with reference to FIGS. 1 to 3. In the nitride-based semiconductor laser device according to the first embodiment, an n-type contact layer 2 of n-type GaN having a thickness of about 4 μm is formed on a sapphire substrate 1, as shown in FIGS. 1 and 2. An n-type cladding layer 3 of n-type $Al_{0.03}Ga_{0.97}N$ having a thickness of about 1 μm is formed on the n-type contact layer 2. According to the first embodiment, the Al composition of the n-type cladding layer 3 is reduced for reducing the difference between the refractive index thereof and that of an emission layer 5 described later, thereby increasing light spreading from the emission layer 5 into the n-type cladding layer 3.

According to the first embodiment, an n-type light spreading layer 4 of n-type $Al_{0.15}Ga_{0.85}N$ having a thickness of about 20 nm is formed on the n-type cladding layer 3. This n-type light spreading layer 4 has a smaller refractive index and a larger band gap than the n-type cladding layer 3. The n-type cladding layer 3 is an example of the "first cladding layer" in the present invention, and the n-type light spreading layer 4 is an example of the "light spreading layer" in the present invention.

The emission layer 5 consisting of a multilevel film structure is formed on the n-type light spreading layer 4. As shown in FIG. 3, the emission layer 5 consisting of a multilevel film structure has a multiple quantum well (MQW) active layer formed by alternately stacking three quantum well layers 51 of $In_xGa_{1-x}N$ each having a thickness of about 4 nm and four quantum barrier layers 52 of $In_yGa_{1-y}N$ each having a thickness of about 20 nm, where x>y and x=0.13 and y=0.05 in the first embodiment.

According to the first embodiment, an n-type carrier blocking layer 53 of n-type $Al_{0.15}Ga_{0.85}N$ having a thickness of about 20 nm is formed under the lower surface of the MQW active layer while an n-type light guiding layer 54 of n-type GaN having a thickness of about 100 nm is formed under the n-type carrier blocking layer 53. The n-type carrier blocking layer 53 is formed to have a larger band gap than the n-type light guiding layer 54. The n-type carrier blocking layer 53 has functions of inhibiting carriers from overflowing and spreading light. A p-type carrier blocking layer 55 of p-type $Al_{0.15}Ga_{0.85}N$ having a thickness of about 20 nm is formed on the upper surface of the MQW active layer while a p-type light guiding layer 56 of p-type GaN having a thickness of about 100 nm is formed on the p-type carrier blocking layer 55. The p-type carrier blocking layer 55 is formed to have a larger band gap than the p-type light guiding layer 56. The p-type carrier blocking layer 55 has functions of inhibiting carriers from overflowing and spreading light.

The MQW active layer is an example of the "active layer" in the present invention, and the n- and p-type carrier blocking layers 53 and 55 are examples of the "carrier blocking layer" in the present invention. The n- and p-type light guiding layers 54 and 56 are examples of the "light guiding layer" in the present invention.

According to the first embodiment, further, a p-type light spreading layer 6 of p-type $Al_{0.15}Ga_{0.85}N$ having a thickness of about 20 nm is formed on the emission layer 5. A p-type cladding layer 7 of $Al_{0.03}Ga_{0.97}N$ having a projecting portion is formed on the p-type light spreading layer 6. The p-type light spreading layer 6 has a smaller refractive index and a larger band gap than the p-type cladding layer 7. According to the first embodiment, the Al composition of the p-type cladding layer 7 is reduced for reducing the difference between the refractive indices of the emission layer 5 and the p-type cladding layer 7. Thus, light spreading from the emission layer 5 to the p-type cladding layer 7 is increased. The p-type cladding layer 7 is an example of the "second cladding layer" in the present invention, and the p-type light spreading layer 6 is an example of the "light spreading layer" in the present invention.

The thickness of the projecting portion of the p-type cladding layer 7 is about 0.3 µm, while that of the remaining region is about 0.1 µm. A p-type contact layer 8 of GaN having a thickness of about 0.07 µm is formed on the upper surface of the projecting portion of the p-type cladding layer 7. The p-type contact layer 8 and the projecting portion of the p-type cladding layer 7 form a ridge portion 9.

The regions from the p-type cladding layer 7 to the n-type contact layer 2 are partially removed. A current blocking layer 10 of $SiO_2$ having a thickness of about 0.2 µm is formed on the removed and exposed part of the n-type contact layer 2, the exposed side surfaces of the n-type cladding layer 3, the n-type light spreading layer 4, the emission layer 5, the p-type light spreading layer 6, the p-type cladding layer 7 and the p-type contact layer 8, the upper surface of the region of the p-type cladding layer 7 excluding the ridge portion 9 and the upper surface of the ridge portion 9 in the vicinity of a cavity end surface.

A p-side ohmic electrode 11 consisting of a lower Pt layer having a thickness of about 1 nm and an upper Pd layer having a thickness of about 3 nm is formed on the p-type contact layer 8. Further, a p-side pad electrode 12 consisting of a lower Ni layer having a thickness of about 0.1 µm and an upper Au layer having a thickness of about 3 µm is formed on the p-side ohmic electrode 11 and the current blocking layer 10.

In addition, an n-side ohmic electrode 13 consisting of a lower Ti layer having a thickness of about 10 nm and an upper Al layer having a thickness of about 0.1 µm is formed on a part of the exposed portion of the n-type contact layer 2 formed with no current blocking layer 10. An n-side pad electrode 14 consisting of a lower Ni layer having a thickness of about 0.1 µm and an upper Au layer having a thickness of about 3 µm is formed on the n-side ohmic electrode 13.

According to the first embodiment, as hereinabove described, the n- and p-type carrier blocking layers 53 and 55 having larger band gaps than the n- and p-type light guiding layers 54 and 56 are provided between the MQW active layer and the n-type light guiding layer 54 and between the MQW active layer and the p-type light guiding layer 56 respectively in the emission layer 5. Also when light spreading is increased, therefore, the n- and p-type carrier blocking layers 53 and 55 can inhibit carriers from overflowing from the emission layer 5 into the n- and p-type cladding layers 3 and 7. Thus, a threshold current and an operating current can be inhibited from increase resulting from difficulty in light emission followed by overflow of the carriers. Consequently, the nitride-based semiconductor laser device can be inhibited from deterioration resulting from rise of the internal temperature following increase of the operating current, whereby the life of the device can be elongated.

According to the first embodiment, further, the n- and p-type light spreading layers 4 and 6 having smaller refractive indices and larger band gaps than the n- and p-type cladding layers 3 and 7 are provided between the emission layer 5 and the n- and p-type cladding layers 3 and 7 respectively, so that the n- and p-type light spreading layers 4 and 6 can increase light spreading from the emission layer 5 to the n- and p-type cladding layers 3 and 7 due to the refractive indices smaller than those of the n- and p-type cladding layers 3 and 7 and strongly confine carriers in the emission layer 5 due to the band gaps larger than those of the n- and p-type cladding layers 3 and 7. Thus, light spreading can be so increased as to reduce optical density in the device. Therefore, light absorption resulting from crystal defects can be so reduced as to suppress increase of the operating current resulting from light absorption. Further, the carriers (electrons and holes), which can be strongly confined in the emission layer 5 as hereinabove described, can be further inhibited from overflowing from the emission layer 5 into the n- and p-type cladding layers 3 and 7. Thus, the threshold current and the operating current can be further inhibited from increase followed by overflow of the carriers. Thus, the operating current can be further inhibited from increase, whereby the device can be further inhibited from deterioration resulting from rise of the internal temperature following increase of the operating current, and the life of the device can consequently be further elongated.

In the nitride-based semiconductor laser device according to the first embodiment, further, light spreading can be increased as hereinabove described, whereby the vertical beam divergence angle in lasing can be reduced to about 16°. Thus, the vertical beam divergence angle can be remarkably reduced as compared with a conventional nitride-based semiconductor laser device prepared to have a large vertical beam divergence angle of about 30°.

A method of fabricating the nitride-based semiconductor laser device according to the first embodiment is now described with reference to FIGS. 4 to 7.

Figure 4:
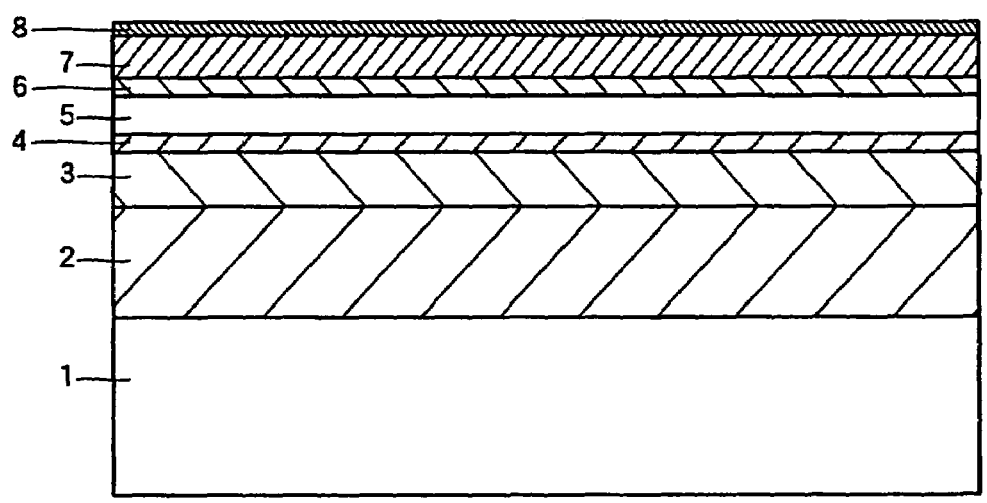
FIGS. 4 to 7 are sectional views for illustrating a method of fabricating the nitride-based semiconductor laser device according to the first embodiment shown in FIGS. 1 to 3.

First, the n-type contact layer 2 of n-type GaN having the thickness of about 4 µm, the n-type cladding layer 3 of n-type $Al_{0.03}Ga_{0.97}N$ having the thickness of about 1 µm, the n-type light spreading layer 4 of n-type $Al_{0.15}Ga_{0.85}N$ having the thickness of about 20 nm and the emission layer 5 consisting of a multilevel film structure are successively formed on the sapphire substrate 1 by MOCVD (metal organic chemical vapor deposition), as shown in FIG. 4.

Figure 3:
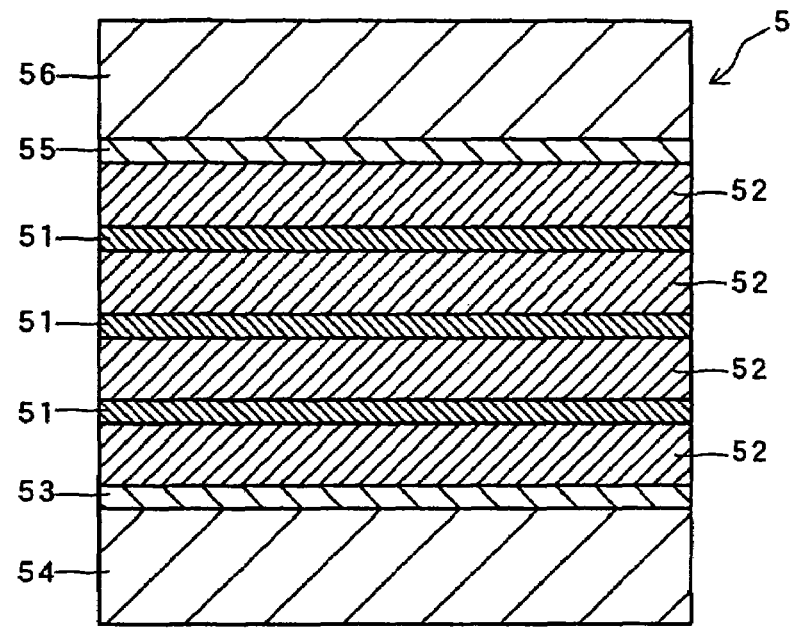
FIG. 3 is a sectional view showing an emission layer of the nitride-based semiconductor laser device according to the first embodiment shown in FIGS. 1 and 2 in detail.

In order to form the emission layer 5 consisting of a multilevel film structure, the n-type light guiding layer 54 of n-type GaN having the thickness of about 100 nm and the n-type carrier blocking layer 53 of n-type $Al_{0.15}Ga_{0.85}N$ having the thickness of about 20 nm are successively formed on the n-type light spreading layer 4, as shown in FIG. 3. Then, the four quantum barrier layers 52 of $In_yGa_{1-y}N$ each having the thickness of about 20 nm and the three quantum well layers 51 of $In_xGa_{1-x}N$ each having the thickness of about 4 nm are alternately successively formed on the n-type carrier blocking layer 53, thereby forming the MQW active layer. Then, the p-type carrier blocking layer 55 of p-type $Al_{0.15}Ga_{0.85}N$ having the thickness of about 20 nm and the p-type light guiding layer 56 of p-type GaN having the thickness of about 100 nm are successively formed on the MQW active layer.

Then, the p-type light spreading layer 6 of p-type $Al_{0.15}Ga_{0.85}N$ having the thickness of about 20 nm, the p-type cladding layer 7 of $Al_{0.03}Ga_{0.97}N$ having the thickness of about 0.3 µm and the p-type contact layer 8 of p-type GaN having the thickness of about 0.07 µm are successively formed on the emission layer 5 by MOCVD, as shown in FIG. 4. In this crystal growth, Si and Mg are employed as n- and p-type dopants respectively.

Figure 5:
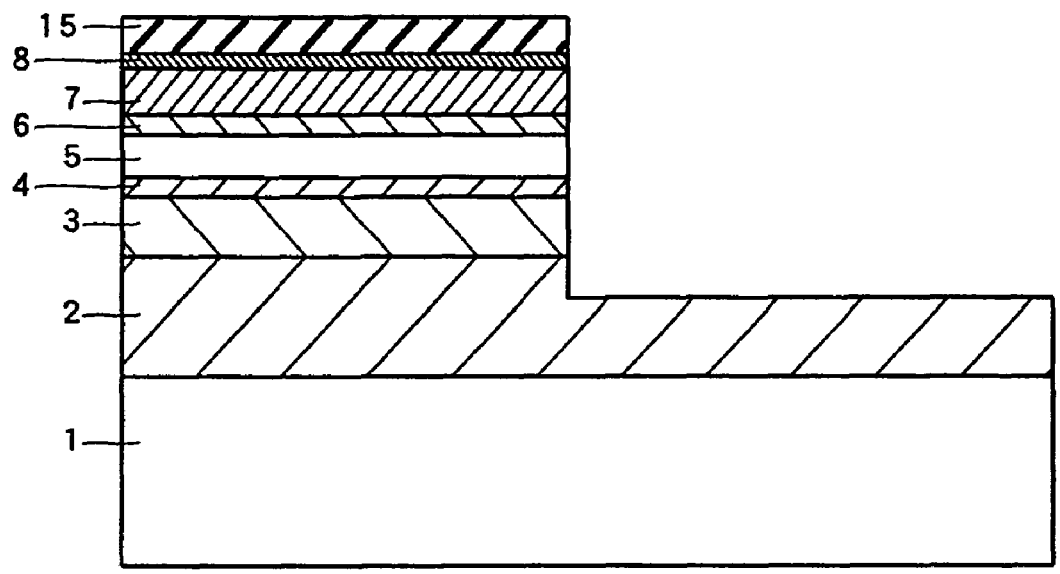

Then, an SiO₂ film 15 having a thickness of about 0.2 μm is formed on the overall surface of the p-type contact layer 8 by plasma CVD, as shown in FIG. 5. The SiO₂ film 15 is partially removed by photolithography and hydrofluoric acid-based etching. RIE (reactive ion etching) is performed with chlorine-based gas up to intermediate portions of the p-type contact layer 8, the p-type cladding layer 7, the p-type light spreading layer 6, the emission layer 5, the n-type light spreading layer 4, the n-type cladding layer 3 and the n-type contact layer 2, thereby partially exposing the upper surface of the n-type contact layer 2.

Figure 6:
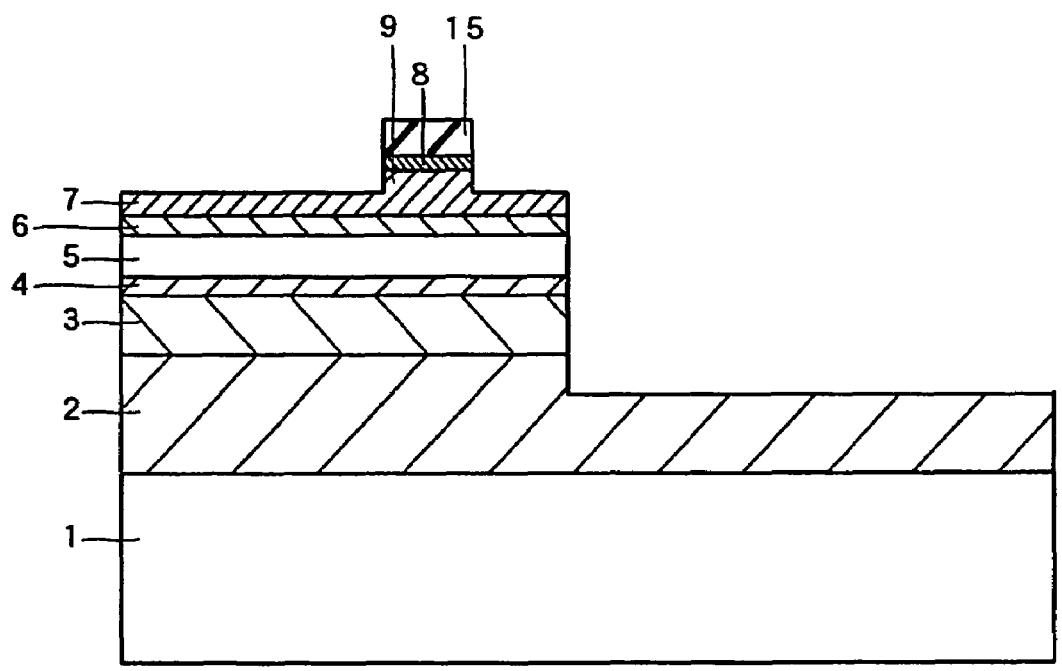

Then, the SiO₂ film 15 is patterned by photolithography and hydrofluoric acid-based etching, thereby forming a striped SiO₂ film 15 having a width of about 2 μm, as shown in FIG. 6. The striped SiO₂ film 15 is employed as an etching mask for partially removing the p-type contact layer 8 and the p-type cladding layer 7 by RIE with chlorine-based gas, thereby forming the ridge portion 9. The depth of etching for forming the ridge portion 9 is set to about 0.27 μm from the upper surface of the p-type contact layer 8. Thus, the portion of the p-type cladding layer 7 excluding the ridge portion 9 has a thickness of about 0.1 μm. Thereafter the SiO₂ film 15 located on the ridge portion 9 is removed by hydrofluoric acid-based etching.

Figure 7:
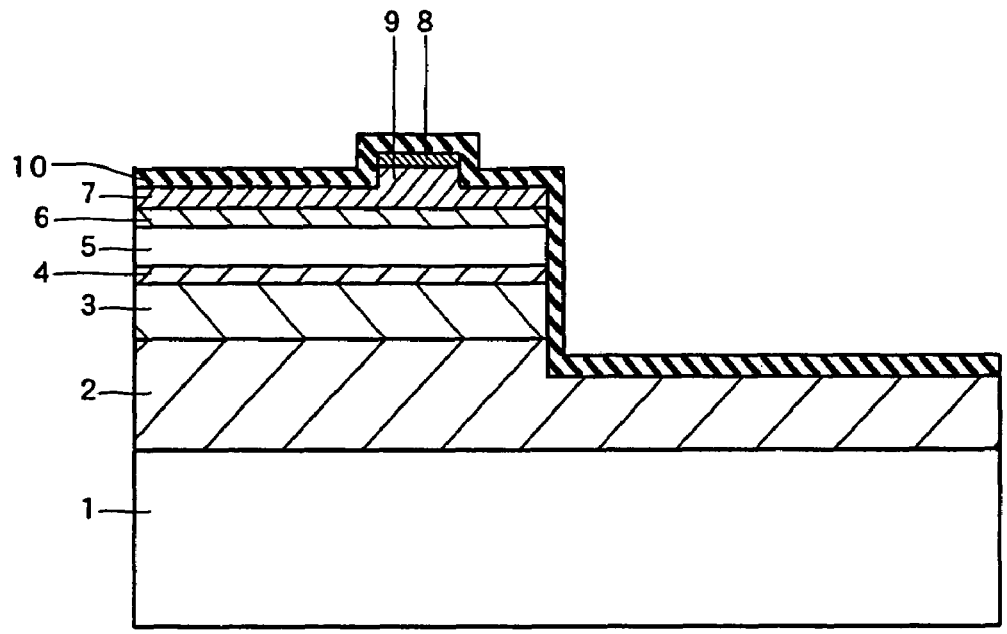

Then, the current blocking layer 10 of SiO₂ having the thickness of about 0.2 μm is formed by plasma CVD to cover the overall surface, as shown in FIG. 7. Parts of the current blocking layer 10 located on the ridge portion 9 excluding a portion close to the cavity end surface and a part of the n-type contact layer 2 are removed by photolithography and RIE with CF₄ thereby partially exposing the upper surface of the p-type contact layer 8 and the upper portion of the n-type contact layer 2, as shown in FIG. 2.

Finally, the p-side ohmic electrode 11 consisting of the lower Pt layer having the thickness of about 1 nm and the upper Pd layer having the thickness of about 3 nm is formed on the p-type contact layer 8 located on the ridge portion 9 excluding the portion close to the cavity end surface by vapor deposition, as shown in FIG. 2. The p-side pad electrode 12 consisting of the lower Ni layer having the thickness of about 0.1 μm and the upper Au layer having the thickness of about 3 μm is formed on the p-side ohmic electrode 11 and the current blocking layer 10. Further, the n-side ohmic electrode 13 consisting of the lower Ti layer having the thickness of about 10 nm and the upper Al layer having the thickness of about 0.1 μm is formed on the n-type contact layer 2 by vapor deposition. In addition, the n-side pad electrode 14 consisting of the lower Ni layer having the thickness of about 0.1 μm and the upper Au layer having the thickness of about 3 μm is formed on the n-side ohmic electrode 13. Thus, the nitride-based semiconductor laser device according to the first embodiment is fabricated.

Second Embodiment

Figure 8:
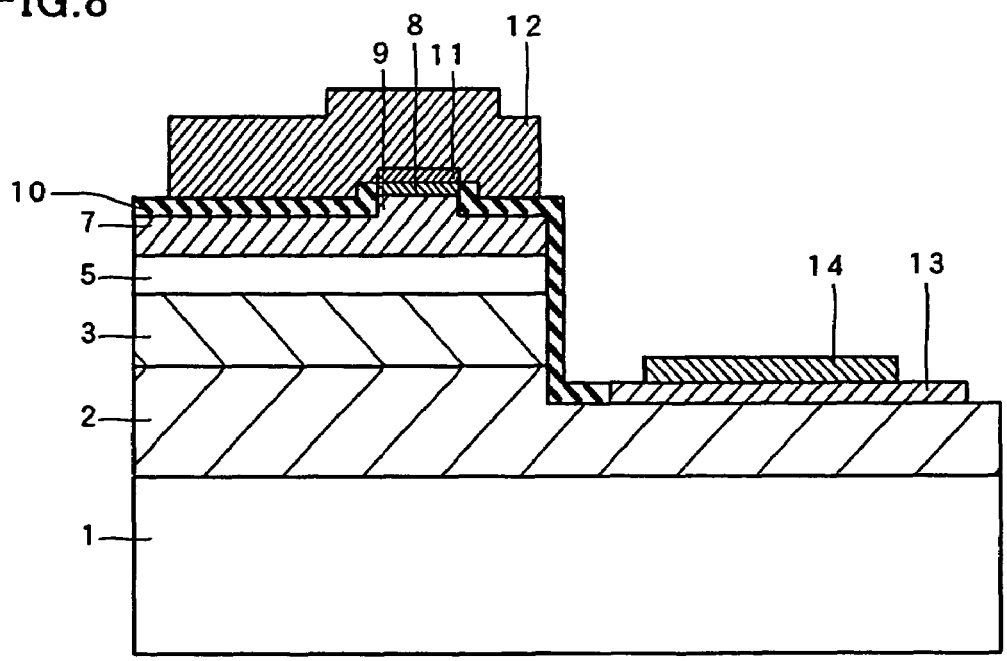
FIG. 8 is a sectional view showing a nitride-based semiconductor laser device according to a second embodiment of the present invention.

Referring to FIG. 8, no light spreading layers are formed between an emission layer 5 and n- and p-type cladding layers 3 and 7 in a nitride-based semiconductor laser device according to a second embodiment of the present invention in a structure similar to that according to the aforementioned first embodiment. The remaining structure of the nitride-based semiconductor laser device according to the second embodiment and a fabrication method therefor are substantially similar to those of the first embodiment.

In the nitride-based semiconductor laser device according to the second embodiment, n- and p-type carrier blocking layers 53 and 55 having larger band gaps than n- and p-type light guiding layers 54 and 56 are provided between an MQW active layer and the n- and p-type light guiding layers 54 and 56 respectively in the emission layer 5, similarly to the nitride-based semiconductor laser device according to the first embodiment shown in FIG. 3. Also when light spreading is increased, therefore, the n- and p-type carrier blocking layers 53 and 55 can inhibit carriers from overflowing from the emission layer 5 into the n- and p-type cladding layers 3 and 7. Therefore, a threshold current and an operating current can be inhibited from increase resulting from difficulty in light emission followed by overflow of the carriers. Consequently, the device can be inhibited from deterioration resulting from rise of the internal temperature following increase of the operating current, whereby the life of the device can be elongated.

According to the second embodiment, the Al compositions of the n- and p-type cladding layers 3 and 7 are so reduced as to reduce the difference between the refractive indices of the emission layer 5 and the n- and p-type cladding layers 3 and 7, whereby light spreading from the emission layer 5 to the n- and p-type cladding layers 3 and 7 can be increased. The nitride-based semiconductor laser device according to the second embodiment provided with no light spreading layers has a smaller degree of light spreading as compared with the nitride-based semiconductor laser device according to the first embodiment. In the nitride-based semiconductor laser device according to the second embodiment, therefore, the vertical beam divergence angle in lasing is about 17°, which is slightly larger than that (about 16°) in the first embodiment. However, the vertical beam divergence angle can be remarkably reduced as compared with a conventional nitride-based semiconductor laser device prepared to have a large vertical beam divergence angle of about 30°. Thus, optical density in the device can be so reduced that light absorption resulting from crystal defects can be reduced. Therefore, an operating current can be inhibited from increase resulting from light absorption. Also according to this, the device can be inhibited from deterioration resulting from rise of the internal temperature following increase of the operating current, whereby the life of the device can be elongated.

Third Embodiment

Figure 9:
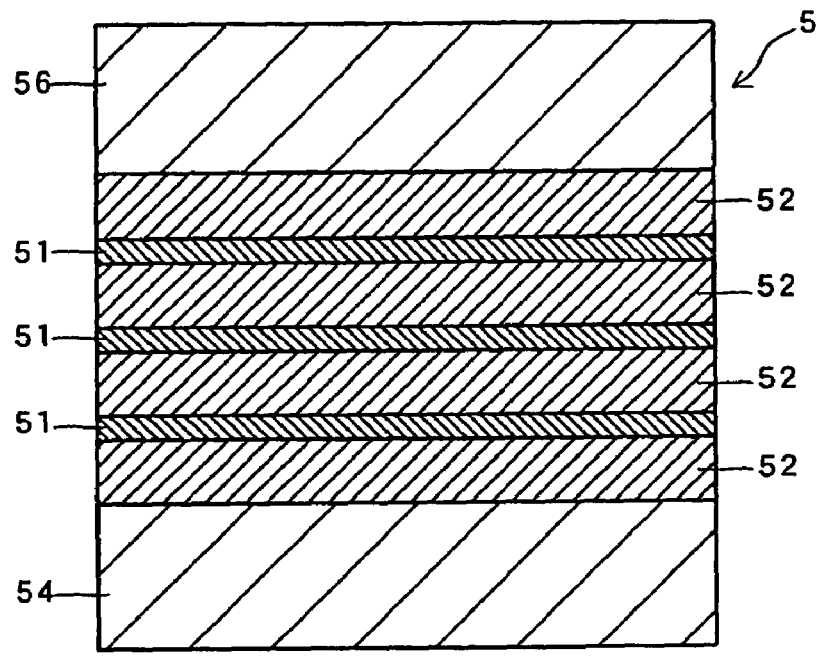
FIG. 9 is a sectional view showing an emission layer of a nitride-based semiconductor laser device according to a third embodiment of the present invention in detail.

Referring to FIG. 9, no carrier blocking layers are formed between an MQW active layer and n- and p-type light guiding layers 54 and 56 in an emission layer 5 in a nitride-based semiconductor laser device according to a third embodiment of the present invention in a structure similar to that of the nitride-based semiconductor laser device according to the first embodiment. The remaining structure of and a fabrication method for the nitride-based semiconductor device according to the third embodiment are substantially similar to those of the nitride-based semiconductor laser device according to the first embodiment.

In the nitride-based semiconductor laser device according to the third embodiment, n- and p-type light spreading layers 4 and 6 having smaller refractive indices and larger band gaps than n- and p-type cladding layers 3 and 7 are provided between the emission layer 5 and the n- and p-type cladding layers 3 and 7 respectively similarly to the nitride-based semiconductor laser device according to the first embodiment shown in FIG. 2. Thus, the n- and p-type light spreading layers 4 and 6 can increase light spreading from the emission layer 5 to the n- and p-type cladding layers 3 and 7 due to the refractive indices smaller than those of the n- and p-type cladding layers 3 and 7 and strongly confine carriers in the emission layer 5 due to the band gaps larger than those of the n- and p-type cladding layers 3 and 7. Therefore, optical density in the device can be reduced. Thus, light absorption resulting from crystal defects can be so reduced that an operating current can be inhibited from increase resulting from light absorption.

The carriers (electrons and holes), which can be strongly confined in the emission layer 5 as hereinabove described, can be inhibited from overflowing from the emission layer 5 into the n- and p-type cladding layers 3 and 7. Thus, a threshold current and the operating current can be inhibited from increase followed by overflow of the carriers.

Thus, the operating current can be so inhibited from increase that the device can be inhibited from deterioration resulting from rise of the internal temperature following increase of the operating current, and the life of the device can consequently be elongated.

According to the third embodiment, each of the light spreading layers 4 and 6 is separated from the MQW active layer by the thickness (about 100 nm) of each of the light guiding layers 54 and 56. On the other hand, the carrier blocking layers 53 and 55 employed in the aforementioned second embodiment are in contact with the MQW active layer. The light spreading layers 4 and 6 and the carrier blocking layers 53 and 55, which must have large band gaps, contain large quantities of Al (these layers 4, 6, 53 and 55 consist of $Al_{0.15}Ga_{0.85}N$ in the second and third embodiments). Al, which is an active element, easily reacts with impurity gas such as oxygen or carbon, for example, present in a crystal growth apparatus. Therefore, an impurity element such as oxygen or carbon, for example, present in the crystal growth apparatus is easily accumulated on the interfaces between the light spreading layers 4 and 6 and the carrier blocking layers 53 and 55 and the upper layers in contact with these layers 4, 6, 53 and 55, i.e., the interface between the n-type light spreading layer 4 and the lower surface of the emission layer 5 (the lower surface of the n-type light guiding layer 54), the interface between the p-type light spreading layer 6 and the lower surface of the p-type cladding layer 7, the interface between the n-type carrier blocking layer 53 and the lower surface of the lowermost quantum barrier layer 52 and the interface between the p-type carrier blocking layer 55 and the lower surface of the p-type light guiding layer 56. The impurity element may form an impurity level, to cause light absorption through the impurity level. Consequently, the threshold current and the operating current may be increased. According to the third embodiment, as hereinabove described, each of these interfaces can be separated from the MQW active layer by the thickness (about 100 nm) of each of the light guiding layers 54 and 56 as compared with the second embodiment. Optical density is reduced as the interface is separated from the MQW active layer, and hence light absorption caused on the aforementioned interfaces is more reduced in the third embodiment as compared with the second embodiment. According to the third embodiment, therefore, the threshold current and the operating current can be further inhibited from increase as compared with the second embodiment.

According to the third embodiment, the difference between the refractive indices of the emission layer 5 and the n- and p-type cladding layers 3 and 7 is reduced and the n- and p-type light spreading layers 4 and 6 are provided so that light spreading can be increased similarly to the first embodiment, whereby the vertical beam divergence angle in lasing can be reduced to about 18°. In other words, the vertical beam divergence angle can be remarkably reduced as compared with a conventional nitride-based semiconductor laser device prepared to have a large vertical beam divergence angle of about 30°. According to the third embodiment, the nitride-based semiconductor laser device has no carrier blocking layers having a carrier blocking function and hence confinement of carriers is weakened as compared with the first embodiment.

While the light guiding layers 54 and 56 are provided on both sides of the MQW active layer, either light guiding layer 54 or 56 is more preferably omitted. In this case, the MQW active layer is provided with only a single light guiding layer for confining light, whereby optical confinement in the MQW active layer can be reduced as compared with the third embodiment shown in FIG. 9. Therefore, light spreading to the n-type cladding layer 3 or the p-type cladding layer 7 can be increased. The n- and p-type light spreading layers 4 and 6 having larger band gaps than the n- and p-type cladding layers 3 and 7 are provided on both of the upper and lower surfaces of the emission layer 5, whereby carriers (electrons and holes) can be inhibited from overflowing from the emission layer 5 into the n- and p-type cladding layers 3 and 7. Consequently, the threshold current can be inhibited from increase while the vertical beam divergence angle in lasing can be reduced to about 16° similarly to the first embodiment when either light guiding layer 54 or 56 is omitted in the third embodiment.

Fourth Embodiment

Figure 10:
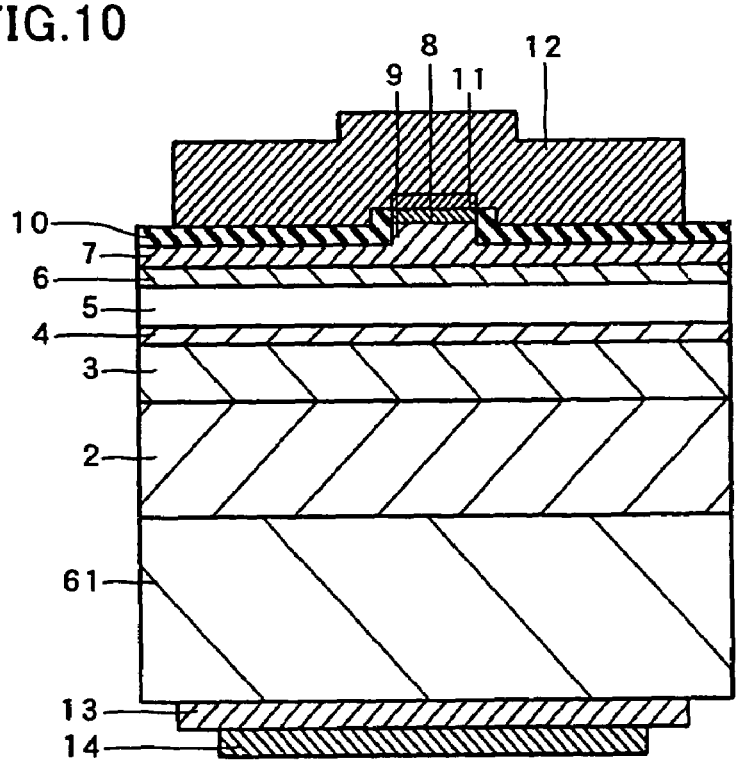
FIG. 10 is a sectional view showing a nitride-based semiconductor laser device according to a fourth embodiment of the present invention.

Referring to FIG. 10, a conductive n-type GaN substrate 61 is employed in a nitride-based semiconductor laser device according to a fourth embodiment of the present invention in place of the sapphire substrate 1 employed in the first embodiment.

In the nitride-based semiconductor laser device according to the fourth embodiment, an n-side ohmic electrode 13 and an n-side pad electrode 14 are formed on the back surface of the conductive n-type GaN substrate 61, dissimilarly to the nitride-based semiconductor laser device according to the first embodiment. Further, regions from a p-type contact layer 8 to an n-type contact layer 2 are not partially removed also dissimilarly to the nitride-based semiconductor laser device according to the first embodiment. The remaining structure of the nitride-based semiconductor laser device according to the fourth embodiment is substantially similar to that of the nitride-based semiconductor laser device according to the first embodiment.

Effects of the nitride-based semiconductor laser device according to the fourth embodiment are similar to those of the aforementioned first embodiment. In other words, n- and p-type carrier blocking layers 53 and 55 having larger band gaps than n- and p-type light guiding layers 54 and 56 can inhibit carriers from overflowing from an emission layer 5 into n- and p-type cladding layers 3 and 7 also when light spreading is increased, whereby a threshold current and an operating current can be inhibited from increase.

Further, n- and p-type light spreading layers 4 and 6 can increase light spreading from the emission layer 5 to the n- and p-type cladding layers 3 and 7 due to refractive indices smaller than those of the n- and p-type cladding layers 3 and 7 and strongly confine carriers in the emission layer 5 due to band gaps larger than those of the n- and p-type cladding layers 3 and 7. Thus, light spreading can be so increased as to reduce light absorption resulting from crystal defects. Therefore, the operating current can be inhibited from increase resulting from light absorption. The operating current can be inhibited from increase as described above, whereby the device can be inhibited from deterioration resulting from rise of the internal temperature following increase of the operating current. Consequently, the life of the device can be elongated.

The nitride-based semiconductor laser device according to the fourth embodiment can increase light spreading as hereinabove described, whereby the vertical beam divergence angle in lasing can be reduced to about 16°, similarly to the first embodiment.

A method of fabricating the nitride-based semiconductor laser device according to the fourth embodiment is now described with reference to FIGS. 11 to 14.

Figure 11:
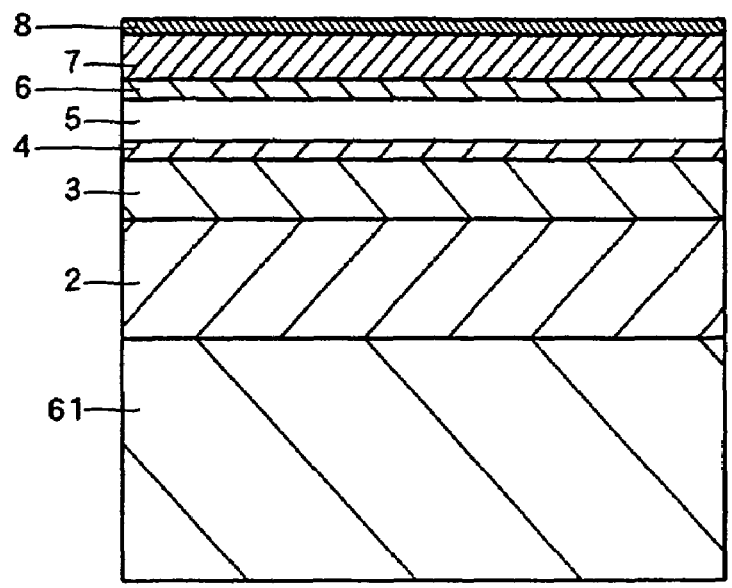
FIGS. 11 to 14 are sectional views for illustrating a method of fabricating the nitride-based semiconductor laser device according to the fourth embodiment shown in FIG. 10.

First, the n-type contact layer 2 of n-type GaN having a thickness of about 4 μm, the n-type cladding layer 3 of n-type $Al_{0.03}Ga_{0.97}N$ having a thickness of about 1 μm, the n-type light spreading layer 4 of n-type $Al_{0.15}Ga_{0.85}N$ having a thickness of about 20 nm and the emission layer 5 consisting of a multilevel film structure are successively formed on the n-type GaN substrate 61 by MOCVD, as shown in FIG. 11.

In order to form the emission layer 5 consisting of a multilevel film structure, the n-type light guiding layer 54 of n-type GaN having a thickness of about 100 nm, the n-type carrier blocking layer 53 of n-type $Al_{0.15}Ga_{0.85}N$ having a thickness of about 20 nm, an MQW active layer, prepared by alternately stacking four quantum barrier layers 52 of $In_yGa_{1-y}N$ each having a thickness of about 20 nm and three quantum well layers 51 of $In_xGa_{1-x}N$ each having a thickness of about 4 nm, the p-type carrier blocking layer 55 of p-type $Al_{0.15}Ga_{0.85}N$ having a thickness of about 20 nm and the p-type light guiding layer 56 of p-type GaN having a thickness of about 100 nm are successively formed on the n-type light spreading layer 4 through a process similar to that for the nitride-based semiconductor laser device according to the first embodiment shown in FIG. 3.

Then, the p-type light spreading layer 6 of p-type $Al_{0.15}Ga_{0.85}N$ having a thickness of about 20 nm, the p-type cladding layer 7 of $Al_{0.03}Ga_{0.97}N$ having a thickness of about 0.3 μm and the p-type contact layer 8 of p-type GaN having a thickness of about 0.07 μm are successively formed on the emission layer 5 by MOCVD. In the aforementioned crystal growth, Si and Mg are employed as n- and p-type dopants respectively.

Figure 12:
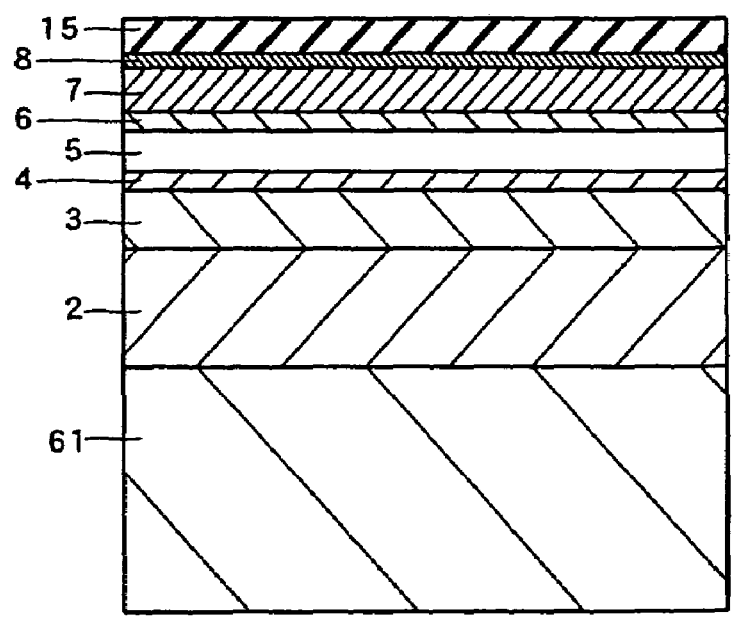
Figure 13:
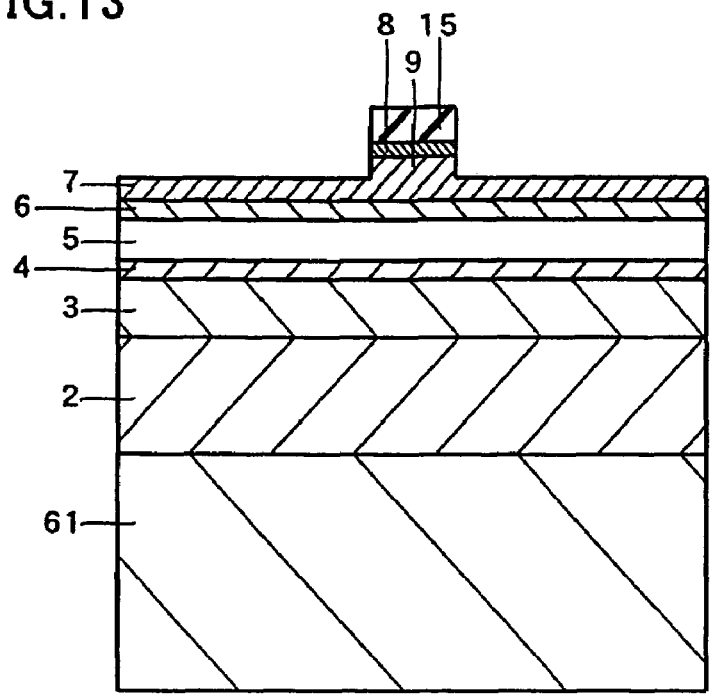

Then, an $SiO_2$ film 15 having a thickness of about 0.2 μm is formed on the overall surface of the p-type contact layer 8 by plasma CVD, as shown in FIG. 12. The $SiO_2$ film 15 is patterned by photolithography and hydrofluoric acid-based etching, thereby forming a striped $SiO_2$ film 15 having a width of about 2 μm as shown in FIG. 13. The striped $SiO_2$ film 15 is employed as an etching mask for partially removing the p-type contact layer 8 and the p-type cladding layer 7 by RIE with chlorine-based gas, thereby forming a ridge portion 9. The depth of etching for forming the ridge portion 9 is set to about 0.27 μm from the upper surface of the p-type contact layer 8. Thus, the portion of the p-type cladding layer 7 excluding the ridge portion 9 has a thickness of about 0.1 μm. Thereafter the $SiO_2$ film 15 located on the ridge portion 9 is removed by hydrofluoric acid-based etching.

Figure 14:
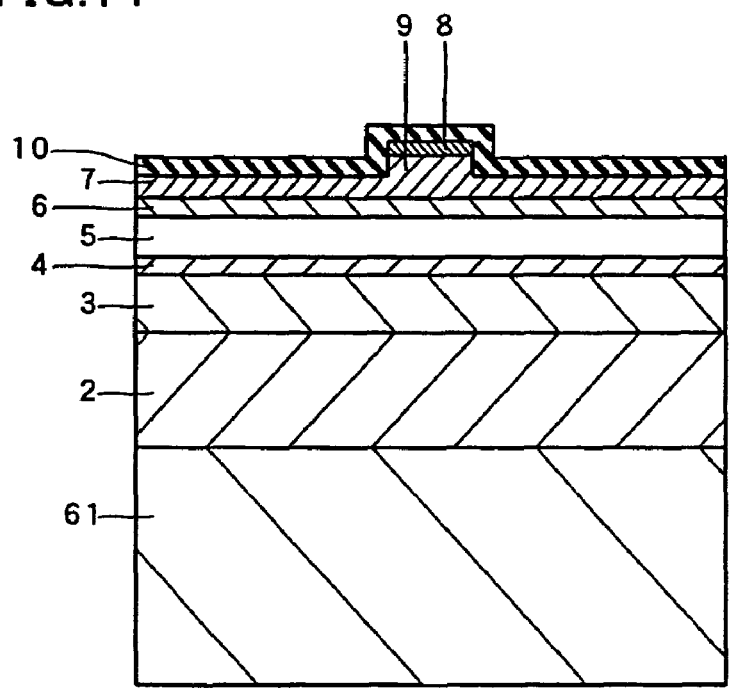

Then, a current blocking layer 10 of $SiO_2$ having a thickness of about 0.2 μm is formed by plasma CVD to cover the overall surface, as shown in FIG. 14. A part of the current blocking layer 10 located on the ridge portion 9 excluding a portion close to the cavity end surface is removed by photolithography and RIE with $CF_4$ thereby partially exposing the upper surface of the p-type contact layer 8, as shown in FIG. 10.

Finally, a p-side ohmic electrode 11 consisting of a lower Pt layer having a thickness of about 1 nm and an upper Pd layer having a thickness of about 3 nm is formed on the p-type contact layer 8 located on the ridge portion 9 excluding the portion close to the cavity end surface by vapor deposition, as shown in FIG. 10. A p-side pad electrode 12 consisting of a lower Ni layer having a thickness of about 0.1 μm and an upper Au layer having a thickness of about 3 μm is formed on the p-side ohmic electrode 11 and the current blocking layer 10. The back surface of the n-type GaN substrate 61 is polished by lapping until the substrate 61 exhibits a thickness of about 100 μm. Thereafter an n-side ohmic electrode 13 consisting of a lower Ti layer having a thickness of about 10 nm and an upper Al layer having a thickness of about 0.1 μm is formed on the back surface of the n-type GaN substrate 61. In addition, an n-side pad electrode 14 consisting of a lower Ni layer having a thickness of about 0.1 μm and an upper Au layer having a thickness of about 3 μm is formed under the n-side ohmic electrode 13. Thus, the nitride-based semiconductor laser device according to the fourth embodiment is fabricated.

Fifth Embodiment

Figure 15:
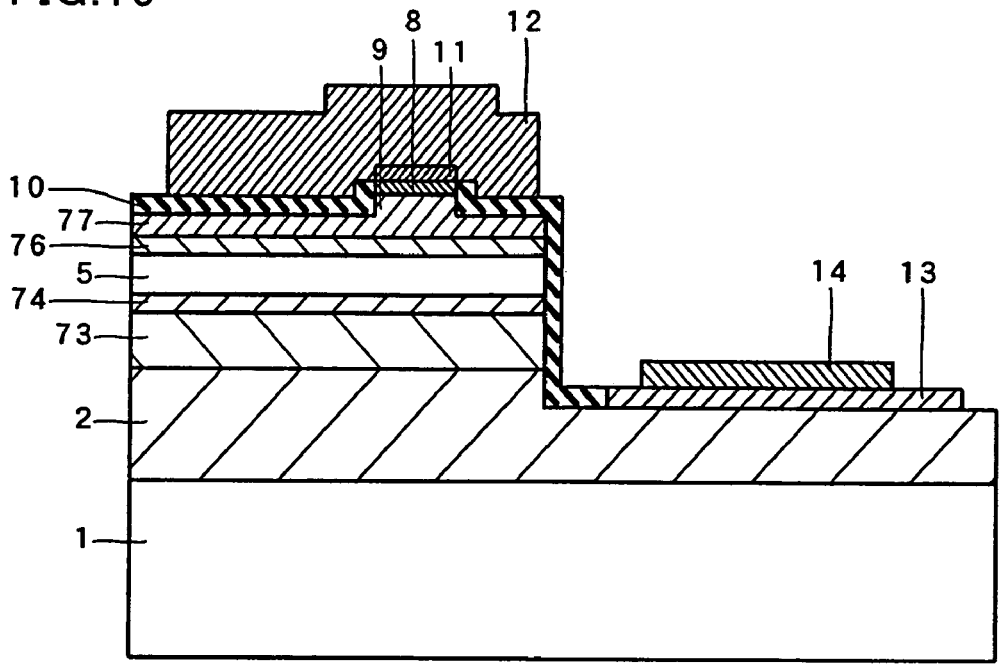
FIG. 15 is a sectional view showing a nitride-based semiconductor laser device according to a fifth embodiment of the present invention.
Figure 16:
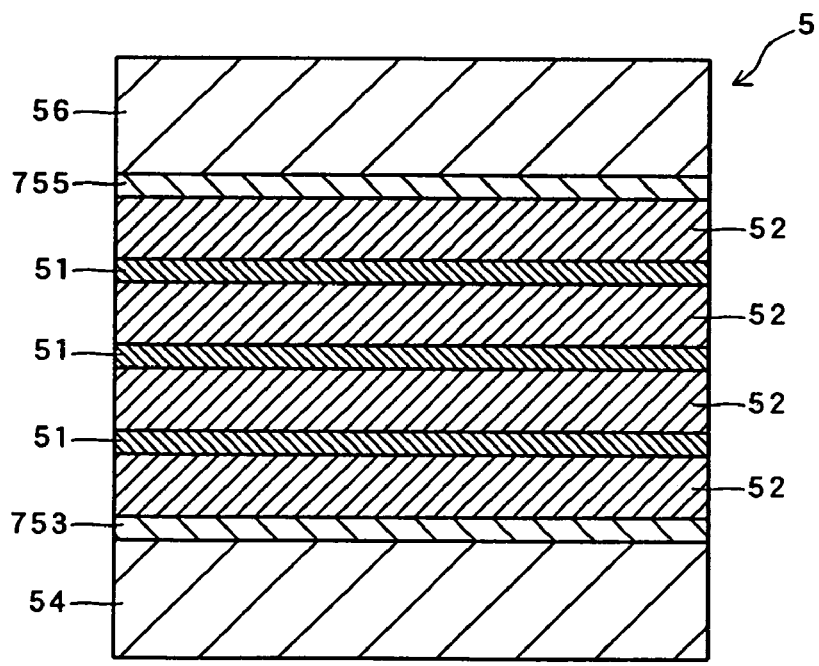
FIG. 16 is a sectional view showing an emission layer of the nitride-based semiconductor laser device according to the fifth embodiment shown in FIG. 15 in detail.

Referring to FIGS. 15 and 16, quaternary mixed crystal materials of AlInGaN are employed in a nitride-based semiconductor laser device according to a fifth embodiment of the present invention in place of the ternary mixed crystal materials of AlGaN employed in each of the nitride-based semiconductor laser devices according to the aforementioned first to fourth embodiments.

More specifically, n- and p-type cladding layers 73 and 77 consisting of $Al_{0.12}In_{0.05}Ga_{0.83}N$ are employed in place of the n- and p-type cladding layers 3 and 7 consisting of $Al_{0.03}Ga_{0.97}N$ employed in the first to fourth embodiments. Further, n- and p-type light spreading layers 74 and 76 and n- and p-type carrier blocking layers 753 and 755 consisting of $Al_{0.24}In_{0.05}Ga_{0.71}N$ are employed in place of the n- and p-type light spreading layers 4 and 6 and the n- and p-type carrier blocking layers 53 and 55 consisting of $Al_{0.15}Ga_{0.85}N$ employed in the first to fourth embodiments.

The n- and p-type light spreading layers 74 and 76 have smaller refractive indices and larger band gaps than the n- and p-type cladding layers 73 and 77. Further, the n- and p-type carrier blocking layers 753 and 755 have larger band gaps than n- and p-type light guiding layers 54 and 56. The n- and p-type carrier blocking layers 753 and 755 have functions of inhibiting carriers from overflowing and spreading light. The n-type cladding layer 73 is an example of the "first cladding layer" in the present invention, and the p-type cladding layer 77 is an example of the "second cladding layer" in the present invention. The n- and p-type light spreading layers 74 and 76 are examples of the "light spreading layer" in the present invention. The n- and p-type carrier blocking layers 753 and 755 are examples of the "carrier blocking layer" in the present invention. The remaining structure of and a fabrication method for the nitride-based semiconductor laser device according to the fifth embodiment are substantially similar to those in the first embodiment.

The quaternary mixed crystal material $Al_{0.12}In_{0.05}Ga_{0.83}N$ employed for the n- and p-type cladding layers 73 and 77 in the fifth embodiment has a refractive index of 2.540, which is substantially identical to that of the ternary mixed crystal material $Al_{0.03}Ga_{0.97}N$ employed in the first to fourth embodiments. Further, the quaternary mixed crystal material $Al_{0.24}In_{0.05}Ga_{0.71}N$ employed for the n- and p-type light spreading layers 74 and 76 and the n- and p-type carrier blocking layers 753 and 755 in the fifth embodiment has a refractive index of 2.501, which is substantially identical to that of the ternary mixed crystal material $Al_{0.15}Ga_{0.85}N$ employed in the first to fourth embodiments. Thus, the nitride-based semiconductor laser device according to the fifth embodiment can attain effects similar to those of the first to fourth embodiments in optical confinement.

Further, the quaternary mixed crystal material $Al_{0.12}In_{0.05}Ga_{0.83}N$ employed for the n- and p-type cladding layers 73 and 77 in the fifth embodiment has a larger band gap than the ternary mixed crystal material $Al_{0.03}Ga_{0.97}N$, while the quaternary mixed crystal material $Al_{0.24}In_{0.05}Ga_{0.71}N$ employed for the n- and p-type light spreading layers 74 and 76 and the n- and p-type carrier blocking layers 753 and 755 in the fifth embodiment also has a larger band gap than the ternary mixed crystal material $Al_{0.15}Ga_{0.85}N$. Comparing ternary and quaternary mixed crystal materials having the same refractive indices with each other, therefore, the quaternary mixed crystal material has a larger band gap than the ternary mixed crystal material.

Figure 17:
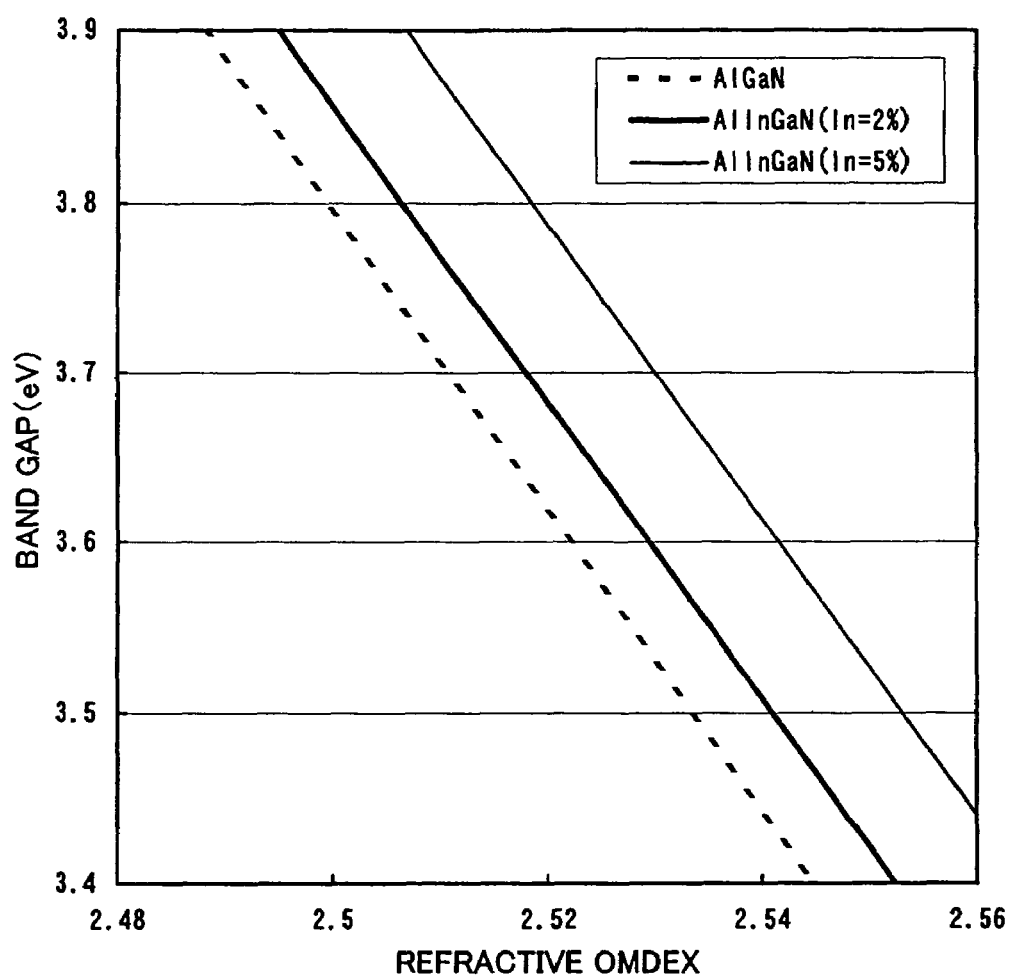
FIG. 17 is a graph showing the relation between band gaps and refractive indices of ternary and quaternary mixed crystal materials in relation the fifth embodiment of the present invention obtained by calculation.

FIG. 17 is a graph showing the relation between the band gaps and the refractive indices of ternary and quaternary mixed crystal materials in relation to the fifth embodiment of the present invention obtained by calculation. Referring to FIG. 17, a straight line of AlInGaN (In=2%) shows the relation between the band gaps and the refractive indices with a constant In composition of 2% and various Al and Ga compositions. The general formula of the composition of AlInGaN (In=2%) is $Al_w In_{0.02} Ga_{(0.98-w)}N$. A straight line of AlInGaN (In=5%) shows the relation between the band gaps and the refractive indices with a constant In composition of 5% and various Al and Ga compositions. The general formula of the composition of AlInGaN (In=5%) is $Al_v In_{0.05} Ga_{(0.95-v)}N$.

Referring to FIG. 17, the band gaps and the refractive indices are in substantially linear relation while the band gaps are increased as the refractive indices are reduced in the straight lines of all ternary and quaternary mixed crystal materials. Further, the straight line of the quaternary mixed crystal material AlInGaN (In=2%) is positioned above the straight line of the ternary mixed crystal material AlGaN, while the straight line of the quaternary mixed crystal material AlInGaN (In=5%) is positioned above the straight line of the quaternary mixed crystal material AlInGaN (In=2%). Thus, the band gaps are increased in order of AlGaN, $Al_w In_{0.02} Ga_{(0.98-w)}N$ and $Al_v In_{0.05} Ga_{(0.95-v)}N$ at the same refractive index. At the refractive index of 2.52, for example, AlGaN, $Al_w In_{0.02} Ga_{(0.98-w)}N$ and $Al_v In_{0.05} Ga_{(0.95-v)}N$ exhibit band gaps of 3.61, 3.69 and 3.79 respectively. Thus, the band gaps are increased as the quantity of In is increased for the following reason:

The refractive index of each material is increased as the quantity of In is increased. In order to keep the refractive index exhibited before addition of In, it is necessary to reduce the refractive index in the state where In is added. Thus, the Al composition must be increased. When the Al composition is increased, the band gap of AlInGaN is also increased. Thus, the band gap is increased as the quantity of In is increased.

According to the fifth embodiment, the quaternary mixed crystal materials of AlInGaN having larger band gaps than the ternary mixed crystal materials of AlGaN employed in the first to fourth embodiments are so employed that carriers can be more inhibited from overflowing as compared with the nitride-based semiconductor laser devices according to the first to fourth embodiments, whereby a threshold current and an operating current can be remarkably inhibited from increase resulting from difficulty in light emission followed by overflow of the carriers. Consequently, the device can be further inhibited from deterioration resulting from rise of the internal temperature following increase of the operating current, whereby the life of the device can be further elongated as compared with the first embodiment.

The remaining effects of the nitride-based semiconductor laser device according to the fifth embodiment are similar to those of the aforementioned first embodiment. In other words, the n- and p-type carrier blocking layers 753 and 755 having larger band gaps than the n- and p-type light guiding layers 54 and 56 can inhibit carriers from overflowing from an emission layer 5 into the n- and p-type cladding layers 73 and 77 also when light spreading is increased, whereby the threshold current and the operating current can be inhibited from increase.

Further, the n- and p-type light spreading layers 74 and 76 can increase light spreading from the emission layer 5 into the n- and p-type cladding layers 73 and 77 due to the refractive indices smaller than those of the n- and p-type cladding layers 73 and 77 and strongly confine carriers in the emission layer 5 due to the band gaps larger than those of the n- and p-type cladding layers 73 and 77. Thus, light spreading can be so increased as to reduce light absorption resulting from crystal defects. Therefore, the operating current can be inhibited from increase resulting from light absorption. Thus, the operating current can be so inhibited from increase that the device can be inhibited from deterioration resulting from rise of the internal temperature following increase of the operating current. Consequently, the life of the device can be elongated.

In the nitride-based semiconductor laser device according to the fifth embodiment, light spreading can be increased as hereinabove described, whereby the vertical beam divergence angle in lasing can be reduced to about 16°, similarly to the first embodiment.

Sixth Embodiment

Figure 18:
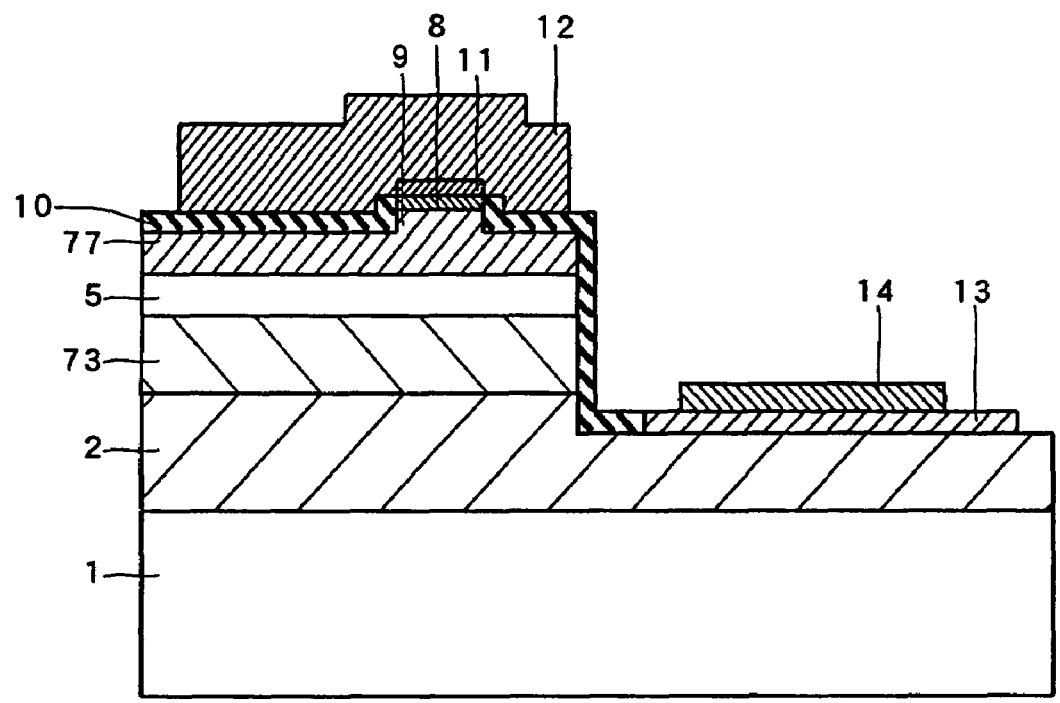
FIG. 18 is a sectional view showing a nitride-based semiconductor laser device according to a sixth embodiment of the present invention.
Figure 19:
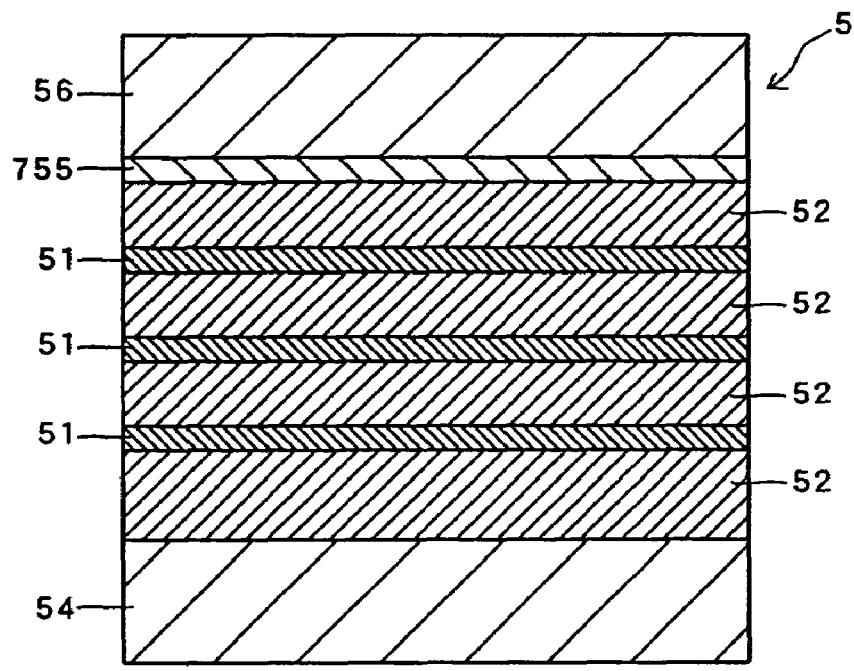
FIG. 19 is a sectional view showing an emission layer of the nitride-based semiconductor laser device according to the sixth embodiment shown in FIG. 18 in detail.

In a nitride-based semiconductor laser device according to a sixth embodiment of the present invention shown in FIGS. 18 and 19, no n- and p-type light spreading layers consisting of $Al_{0.24}In_{0.05}Ga_{0.71}N$ are formed but only a p-type carrier blocking layer 755 consisting of a quaternary mixed crystal material $Al_{0.24}In_{0.05}Ga_{0.71}N$ is provided in a structure similar to that of the aforementioned fifth embodiment. The remaining structure of and a fabrication method for the nitride-based semiconductor laser device according to the sixth embodiment are substantially similar to those in the fifth embodiment.

In the nitride-based semiconductor laser device according to the sixth embodiment, the p-type carrier blocking layer 755 having a larger band gap than a p-type light guiding layer 56 is provided between an MQW active layer and the p-type light guiding layer 56 in an emission layer 5, as shown in FIG. 19. Thus, the p-type carrier blocking layer 755 can inhibit carriers from overflowing from the emission layer 5 into a p-type cladding layer 77 also when the difference between the refractive indices of the emission layer 5 and the p-type cladding layer 77 is reduced thereby increasing light spreading. Thus, a threshold current and an operating current can be inhibited from increase resulting from difficulty in light emission followed by overflow of the carriers.

According to the aforementioned sixth embodiment, the difference between the refractive indices of n- and p-type cladding layers 73 and 77 and the emission layer 5 can be reduced by increasing Al compositions of the n- and p-type cladding layers 73 and 77, whereby light spreading can be increased. In the nitride-based semiconductor laser device according to the sixth embodiment provided with neither n and p-type light spreading layers nor n-type carrier blocking layer, light spreading is reduced as compared with the fifth embodiment. Therefore, the vertical beam divergence angle in lasing is slightly increased to about 18° in the sixth embodiment as compared with that (about 16°) in the fifth embodiment. As compared with a conventional nitride-based semiconductor laser device prepared to have a large vertical beam divergence angle of about 30°, however, the vertical beam divergence angle can be remarkably reduced.

According to the sixth embodiment, further, a quaternary mixed crystal material of AlInGaN having a larger band gap than the ternary mixed crystal materials of AlGaN employed in the first to fourth embodiments so that the carriers can be further inhibited from overflowing similarly to the fifth embodiment, whereby the threshold current and the operating current can be remarkably inhibited from increase. Consequently, the device can be further inhibited from deterioration resulting from rise of the internal temperature following increase of the operating current, whereby the life of the device can be remarkably elongated.

Seventh Embodiment

Figure 20:
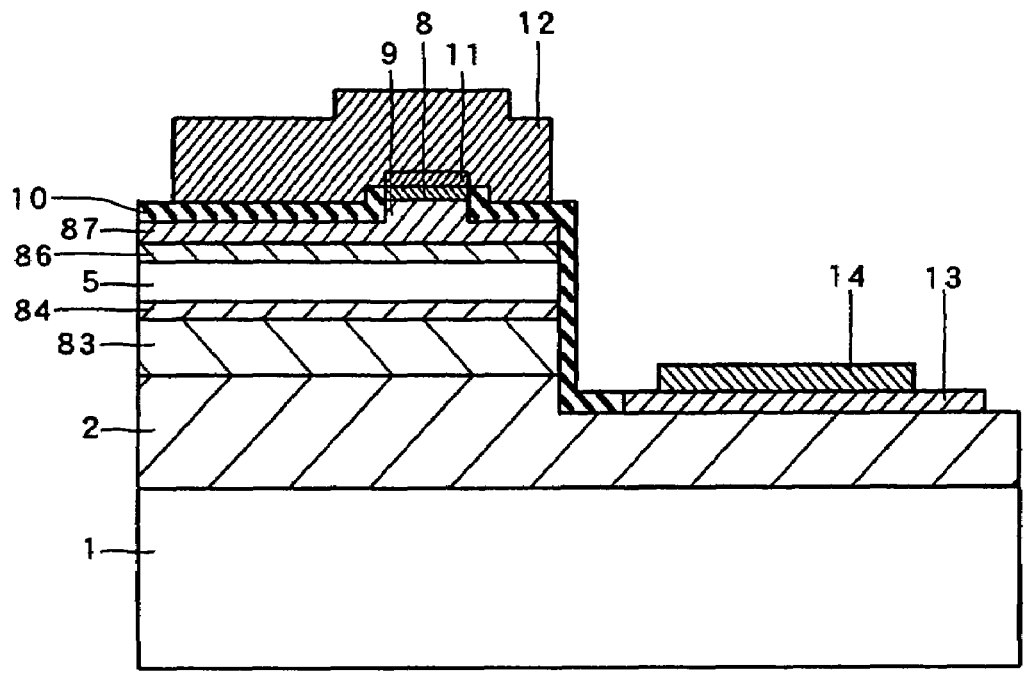
FIG. 20 is a sectional view showing a nitride-based semiconductor laser device according to a seventh embodiment of the present invention.
Figure 21:
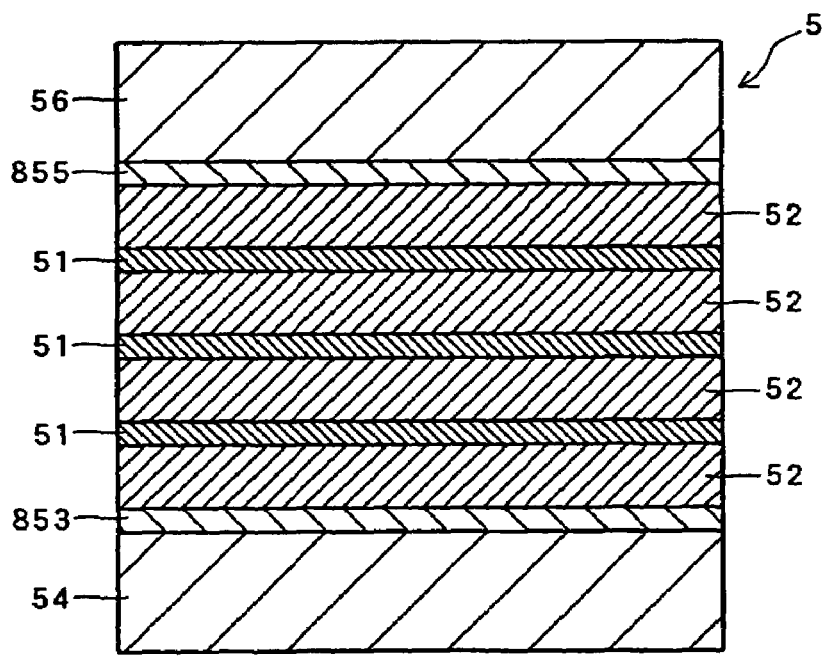
FIG. 21 is a sectional view showing an emission layer of the nitride-based semiconductor laser device according to the seventh embodiment shown in FIG. 20 in detail.

Referring to FIGS. 20 and 21, ternary mixed crystal materials of AlInGaN lattice-matching with GaN are employed in place of the ternary mixed crystal materials of AlGaN employed in the aforementioned first to fourth embodiments in a nitride-based semiconductor laser device according to a seventh embodiment of the present invention.

More specifically, n- and p-type cladding layers 83 and 87 consisting of $Al_{0.04}In_{0.005}Ga_{0.955}N$ are employed in place of the n- and p-type cladding layers 3 and 7 consisting of $Al_{0.03}Ga_{0.97}N$ employed in the first to fourth embodiments. Further, n- and p-type light spreading layers 84 and 86 and n- and p-type carrier blocking layers 853 and 855 consisting of $Al_{0.19}In_{0.025}Ga_{0.785}N$ are employed in place of the n- and p-type light spreading layers 4 and 6 and the n- and p-type carrier blocking layers 53 and 55 consisting of $Al_{0.15}Ga_{0.85}N$ employed in the first to fourth embodiments. In addition, the aforementioned quaternary mixed crystal materials employed in the seventh embodiment, having lattice constants substantially identical to that of GaN, lattice-match with GaN dissimilarly to the quaternary mixed crystal materials employed in the fifth and sixth embodiments.

The n- and p-type light spreading layers 84 and 86 have smaller refractive indices and larger band gaps than the n- and p-type cladding layers 83 and 87. Further, the n- and p-type carrier blocking layers 853 and 855 have larger band gaps than n- and p-type light guiding layers 54 and 56. The n- and p-type carrier blocking layers 853 and 855 have functions of inhibiting carriers from overflowing and spreading light. The n-type cladding layer 83 is an example of the "first cladding layer" in the present invention, and the p-type cladding layer 87 is an example of the "second cladding layer" in the present invention. The n- and p-type light spreading layers 84 and 86 are examples of the "light spreading layer" in the present invention. The n- and p-type carrier blocking layers 853 and 855 are examples of the "carrier blocking layer" in the present invention. The remaining structure of and a fabrication method for the seventh embodiment are similar to those in the first embodiment.

Figure 22:
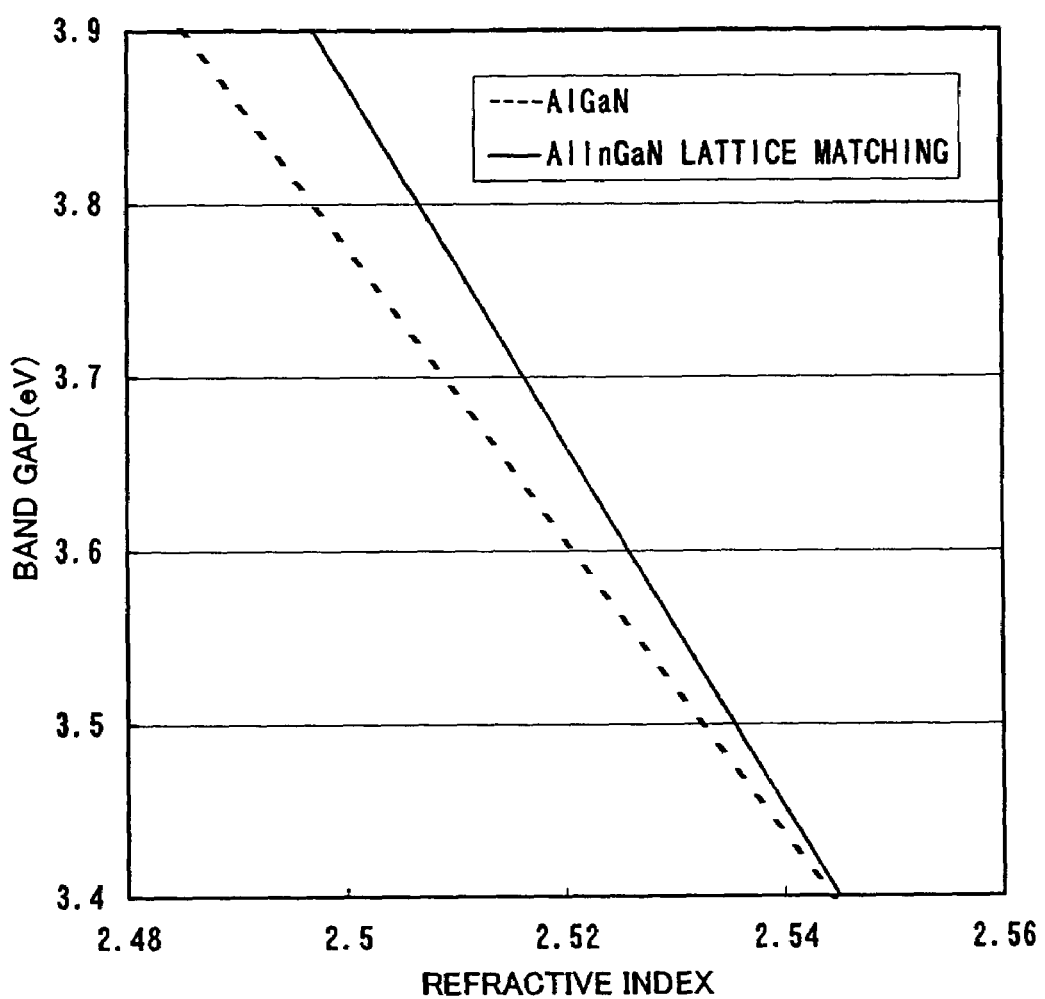
FIG. 22 is a graph showing the relation between band gaps and refractive indices of ternary and quaternary mixed crystal materials, lattice-matching with GaN, in relation to the seventh embodiment of the present invention obtained by calculation.

FIG. 22 is a graph showing the relation between band gaps and refractive indices of the quaternary mixed crystal material lattice-matching with GaN employed in the seventh embodiment of the present invention and a ternary mixed crystal material. Referring to FIG. 22, a straight line showing the quaternary mixed crystal material lattice-matching with GaN is positioned above a straight line showing the ternary mixed crystal material AlGaN. Thus, the band gap of the quaternary mixed crystal material lattice-matching with GaN is larger than that of the ternary mixed crystal material at the same refractive index.

The quaternary mixed crystal material $Al_{0.04}In_{0.005}Ga_{0.955}N$ employed for the n- and p-type cladding layers 83 and 87 in the seventh embodiment has a refractive index of 2.540, which is substantially identical to that of the ternary mixed crystal material $Al_{0.03}Ga_{0.97}N$ employed in the first to fourth embodiments. The quaternary mixed crystal material $Al_{0.19}In_{0.025}Ga_{0.785}N$ employed for the n- and p-type light spreading layers 84 and 86 and the n- and p-type carrier blocking layers 853 and 855 in the seventh embodiment has a refractive index of 2.501, which is substantially identical to that of the ternary mixed crystal material $Al_{0.15}Ga_{0.85}N$ employed in the first to fourth embodiments. Thus, the nitride-based semiconductor laser device according to the seventh embodiment can attain effects similar to those in the first to fourth embodiments in optical confinement. The quaternary mixed crystal materials $Al_{0.04}In_{0.005}Ga_{0.955}N$ and $Al_{0.19}In_{0.025}Ga_{0.785}N$ lattice-matching with GaN have larger band gaps than the ternary mixed crystal materials $Al_{0.03}Ga_{0.97}N$ and $Al_{0.15}Ga_{0.85}N$ respectively.

According to the seventh embodiment, the quaternary mixed crystal materials of AlInGaN having larger band gaps than the ternary mixed crystal materials of AlGaN employed in the first to fourth embodiments so that carriers can be further inhibited from overflowing as compared with the nitride-based semiconductor laser devices according to the first to fourth embodiments, whereby a threshold current and an operating current can be remarkably inhibited from increase resulting from difficulty in light emission followed by overflow of the carriers. Consequently, the device can be further inhibited from deterioration resulting from rise of the internal temperature following increase of the operating current, whereby the life of the device can be further elongated as compared with the first embodiment.

According to the seventh embodiment, the quaternary mixed crystals having the same lattice constant as that of the material for an n-type GaN contact layer 2 are employed in place of the quaternary mixed crystal materials of AlInGaN employed in the fifth and sixth embodiments, whereby formation of crystal defects resulting from difference between lattice constants can be remarkably suppressed as compared with the nitride-based semiconductor laser devices according to the fifth and sixth embodiments. Thus, high-quality crystals can be obtained and light absorption resulting from crystal defects can be reduced, whereby the operating current can be remarkably inhibited from increase resulting from light absorption. Consequently, the device can be further inhibited from deterioration resulting from rise of the internal temperature following increase of the operating current, whereby the life of the device can be remarkably elongated.

The remaining effects of the nitride-based semiconductor laser device according to the seventh embodiment are similar to those of the aforementioned first embodiment. In other words, the n- and p-type carrier blocking layers 853 and 855 having larger band gaps than the n- and p-type light guiding layers 54 and 56 can inhibit carriers from overflowing from an emission layer 5 into the n- and p-type cladding layers 83 and 87 also when light spreading is increased, whereby the threshold current and the operating current can be inhibited from increase.

Further, the n- and p-type light spreading layers 84 and 86 can increase light spreading from the emission layer 5 to the n- and p-type cladding layers 83 and 87 due to the refractive indices smaller than those of the n- and p-type cladding layers 83 and 87 and strongly confine carriers in the emission layer 5 due to the band gaps larger than those of the n- and p-type cladding layers 83 and 87. Thus, light spreading can be so increased that light absorption resulting from crystal defects can be reduced. Therefore, the operating current can be inhibited from increase resulting from light absorption. The operating current can be inhibited from increase as hereinabove described, whereby the device can be inhibited from deterioration resulting from rise of the internal temperature following increase of the operating current. Consequently, the life of the device can be elongated.

In the nitride-based semiconductor laser device according to the seventh embodiment, further, light spreading can be increased as hereinabove described, whereby the vertical beam divergence angle in lasing can be reduced to about 16° similarly to the first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while no buffer layer is formed between the substrate and the n-type contact layer in the nitride-based semiconductor laser device according to each of the aforementioned first to seventh embodiments, the present invention is not restricted to this but a low-temperature buffer layer consisting of AlN, GaN or AlGaN may alternatively be formed between the substrate and the n-type contact layer. Further, a high-temperature buffer layer consisting of undoped AlN, GaN or AlGaN may be formed on the low-temperature buffer layer.

While an n-type cladding layer 3 having a thickness of about 1 μm is formed in the aforementioned seventh embodiment, the present invention is not restricted to this but the n-type cladding layer 3 may alternatively have a large thickness of at least 1.5 μm due to the employment of the quaternary mixed crystal materials having lattice constants equivalent to that of the n-type contact layer 2. In this case, light spreading to the n-type cladding layer 3 can be further increased, whereby the vertical beam divergence angle can be further reduced.

While the n- and p-type light spreading layers 84 and 86 and the n- and p-type carrier blocking layers 853 and 855 consisting of $Al_{0.19}In_{0.025}Ga_{0.785}N$ are formed in the aforementioned seventh embodiment, the present invention is not restricted to this but these layers 84, 86, 853 and 855 may not be formed. In this case, an effect similar to that of the sixth embodiment can be attained. In addition to this effect, further, formation of crystal defects resulting from difference between lattice constants can be suppressed due to the quaternary mixed crystal material having the lattice constant equivalent to that of the material for the n-type GaN contact layer 2. Thus, high-quality crystals can be obtained while light absorption resulting from crystal defects can be reduced, whereby the operating current can be further inhibited from increase resulting from light absorption. Further, the n-type cladding layer 3 can be formed with a large thickness of at least 1.5 μm due to the quaternary mixed crystal material having the lattice constant equivalent to that of the material for the n-type contact layer 2. In this case, light spreading to the n-type cladding layer 3 can be further increased, whereby the vertical beam divergence angle can be further reduced.

What is claimed is:

1. A nitride-based semiconductor laser device comprising:
 a) a first cladding layer consisting of a first conductivity type nitride-based semiconductor;
 b) an emission layer, formed on said first cladding layer, consisting of a nitride-based semiconductor, wherein said emission layer includes:
  an active layer emitting light; and
  a light guiding layer formed adjacent to at least either the upper surface or the lower surface of said active layer for confining light;
 c) a second cladding layer, formed on said emission layer, consisting of a second conductivity type nitride-based semiconductor;
 d) a first light spreading layer having a smaller refractive index and a larger band gap than said either first or second cladding layer; and
 e) a second light spreading layer having a smaller refractive index and a larger band gap than said either second or first cladding layer,
 wherein said first and second light spreading layers are arranged between said light guiding layer and either said first or second cladding layer being formed on the same side of said light guiding layer and between said active layer and either said second or first cladding layer being formed on the opposite side of said light guiding layer, respectively,
 wherein said nitride-based semiconductor laser device reduces the degree of optical confinement in said emission layer, thereby reducing a vertical beam divergence angle to not more than 20°, and
 wherein said first and second light spreading layers are formed adjacent to said light guiding layer and said active layer, respectively.

2. A nitride-based semiconductor laser device comprising:
 a) a first cladding layer consisting of a first conductivity type nitride-based semiconductor;
 b) an emission layer, formed on said first cladding layer, consisting of a nitride-based semiconductor, wherein said emission layer includes:
  an active layer emitting light; and
  a light guiding layer formed adjacent to at least either the upper surface or the lower surface of said active layer for confining light;
 c) a second cladding layer, formed on said emission layer, consisting of a second conductivity type nitride-based semiconductor;
 d) a first nitride-based semiconductor layer having a smaller refractive index and a larger band gap than said either first or second cladding layer; and
 e) a second nitride-based semiconductor layer having a smaller refractive index and a larger band gap than said either second or first cladding layer,
 wherein said first and second nitride-based semiconductor layers are arranged between said light guiding layer and either said first or second cladding layer being formed on the same side of said light guiding layer and between said active layer and either said second or first cladding layer being formed on the opposite side of said light guiding layer, respectively,
 wherein said nitride-based semiconductor laser device reduces the degree of optical confinement in said emission layer, thereby reducing a vertical beam divergence angle to not more than 20°, and
 wherein said first and second nitride-based semiconductor layers are formed adjacent to said light guiding layer and said active layer, respectively.

* * * * *